(12) United States Patent
Higashitani

(10) Patent No.: US 7,403,428 B2
(45) Date of Patent: Jul. 22, 2008

(54) SYSTEMS FOR ERASING NON-VOLATILE MEMORY UTILIZING CHANGING WORD LINE CONDITIONS TO COMPENSATE FOR SLOWER ERASING MEMORY CELLS

(75) Inventor: Masaaki Higashitani, Cupertino, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/296,032

(22) Filed: Dec. 6, 2005

(65) Prior Publication Data
US 2006/0221703 A1   Oct. 5, 2006

Related U.S. Application Data

(60) Provisional application No. 60/667,043, filed on Mar. 31, 2005.

(51) Int. Cl.
*G11C 16/04* (2006.01)
(52) U.S. Cl. .................. 365/185.29; 365/185.18; 365/185.17; 365/185.24; 365/185.33
(58) Field of Classification Search .......... 365/185.29, 365/185.18, 185.17, 185.24, 185.33
See application file for complete search history.

(56) References Cited

U.S. PATENT DOCUMENTS

| | | | |
|---|---|---|---|
| 4,489,400 | A | 12/1984 | Southerland, Jr. |
| 4,580,247 | A | 4/1986 | Adam |
| 5,293,337 | A | 3/1994 | Aritome et al. |
| 5,428,568 | A | 6/1995 | Kobayashi et al. |
| 5,491,809 | A | 2/1996 | Coffman et al. |
| 5,570,315 | A | 10/1996 | Tanaka et al. |
| 5,576,993 | A | 11/1996 | Hong |

(Continued)

FOREIGN PATENT DOCUMENTS

WO   0024002   4/2000

(Continued)

OTHER PUBLICATIONS

Tetsuo Endoh, et al., "A Study of High-Performance NAND Structured EEPROMS,"IEICE Transactions on Electronics, Electronics Society, Tokyo, Japan, vol. E75-C, No. 11, Nov. 1, 1992, pp. 1351-1356.

(Continued)

*Primary Examiner*—Viet Q. Nguyen
(74) *Attorney, Agent, or Firm*—Vierra Magen Marcus & DeNiro LLP

(57) ABSTRACT

Voltage conditions applied to the memory cells of a non-volatile memory system are changed during erase operations in order to equalize the erase behavior of the select memory cells with other memory cells of the system that are being concurrently erased. The changed conditions can compensate for capacitively coupled voltages within a NAND string. After biasing a NAND string for an erase operation and beginning application of the erase voltage pulse, the word lines of one or more interior memory cells can be floated. By floating the selected interior word lines, the peak erase potential created across the tunnel dielectric region of the cells coupled thereto is decreased from its normal level. Consequently, the erase rates of these cells are slowed to substantially match that of the slower erasing end memory cells of the string. Different word lines can be floated at different times to alter the erase behavior of different memory cells by different amounts.

21 Claims, 15 Drawing Sheets

U.S. PATENT DOCUMENTS

| | | | |
|---|---|---|---|
| 5,652,719 A | 7/1997 | Tanaka et al. | |
| 5,768,188 A | 6/1998 | Park et al. | |
| 5,808,338 A | 9/1998 | Gotou | |
| 5,841,721 A | 11/1998 | Kwon et al. | |
| 5,963,477 A | 10/1999 | Hung | |
| 5,978,270 A | 11/1999 | Tanaka et al. | |
| 5,995,417 A | 11/1999 | Chen et al. | |
| 6,041,001 A | 3/2000 | Estakhri | |
| 6,130,841 A | 10/2000 | Tanaka et al. | |
| 6,166,962 A * | 12/2000 | Chen et al. | 365/185.3 |
| 6,198,662 B1 * | 3/2001 | Chen et al. | 365/185.29 |
| 6,222,773 B1 * | 4/2001 | Tanzawa et al. | 365/185.28 |
| 6,249,459 B1 * | 6/2001 | Chen et al. | 365/185.26 |
| 6,353,556 B2 * | 3/2002 | Chen et al. | 365/185.26 |
| 6,381,174 B1 | 4/2002 | Roohparvar et al. | |
| 6,421,276 B1 | 7/2002 | Goltman | |
| 6,452,840 B1 | 9/2002 | Sunkvalli et al. | |
| 6,483,751 B2 * | 11/2002 | Chen et al. | 365/185.26 |
| 6,519,184 B2 | 2/2003 | Tanaka et al. | |
| 6,525,964 B2 | 2/2003 | Tanaka et al. | |
| 6,529,413 B2 | 3/2003 | Lee et al. | |
| 6,618,288 B2 | 9/2003 | Akaogi et al. | |
| 6,620,682 B1 | 9/2003 | Lee et al. | |
| 6,643,183 B2 | 11/2003 | Atsumi et al. | |
| 6,643,184 B2 | 11/2003 | Pio | |
| 6,643,188 B2 | 11/2003 | Tanaka et al. | |
| 6,646,920 B2 | 11/2003 | Takashina et al. | |
| 6,661,711 B2 | 12/2003 | Pan et al. | |
| 6,664,587 B2 | 12/2003 | Guterman et al. | |
| 6,704,222 B2 | 3/2004 | Guterman et al. | |
| 6,711,066 B2 | 3/2004 | Tanzawa et al. | |
| 6,744,670 B2 | 6/2004 | Tamada et al. | |
| 6,771,541 B1 | 8/2004 | Park | |
| 6,842,380 B2 | 1/2005 | Lakhani et al. | |
| 6,859,397 B2 | 2/2005 | Lutze et al. | |
| 6,862,223 B1 | 3/2005 | Lee et al. | |
| 6,894,931 B2 * | 5/2005 | Yaegashi et al. | 365/185.22 |
| 7,009,889 B2 | 3/2006 | Tran et al. | |
| 7,057,936 B2 * | 6/2006 | Yaegashi et al. | 365/185.22 |
| 7,079,437 B2 | 7/2006 | Hazama et al. | |
| 7,102,929 B2 | 9/2006 | Lee et al. | |
| 2002/0133679 A1 | 9/2002 | Choi et al. | |
| 2003/0123296 A1 | 7/2003 | Hirano | |
| 2003/0147278 A1 | 8/2003 | Tanaka et al. | |
| 2003/0189864 A1 | 10/2003 | Sim | |
| 2004/0141378 A1 | 7/2004 | Tanzawa et al. | |
| 2005/0041515 A1 | 2/2005 | Futatsuyama et al. | |
| 2005/0105373 A1 | 5/2005 | Takase et al. | |
| 2005/0128805 A1 | 6/2005 | Lee et al. | |
| 2006/0140012 A1 | 6/2006 | Wan et al. | |
| 2006/0221660 A1 | 10/2006 | Hemink et al. | |
| 2006/0221661 A1 | 10/2006 | Hemink et al. | |
| 2006/0221703 A1 | 10/2006 | Higashitani | |
| 2006/0221705 A1 | 10/2006 | Hemink et al. | |
| 2006/0221708 A1 | 10/2006 | Higashitani | |
| 2006/0221709 A1 | 10/2006 | Hemink et al. | |
| 2006/0279992 A1 | 12/2006 | Park et al. | |
| 2006/0285387 A1 | 12/2006 | Micheloni et al. | |

FOREIGN PATENT DOCUMENTS

| | | |
|---|---|---|
| WO | 2004013864 | 2/2004 |

OTHER PUBLICATIONS

Notice of Allowance and Fee(s) Due, United States Patent & Trademark Office, U.S. Appl. No. 11/025,620 entitled, "Word Line Compensation in Non-Volatile Memory Erase Operations," Mar. 20, 2007.

Office Action, Non-Final, United States Patent & Trademark Office, U.S. Appl. No. 11/296,028 entitled, "Systems for Erasing Non-Volatile Memory Using Individual Verification and Additional Erasing of Subsets of Memory Cells," Mar. 12, 2007.

Office Action, Election/Restriction, United States Patent & Trademark Office, U.S. Appl. No. 11/296,028 entitled, "Systems for Erasing Non-Volatile Memory Using Individual Verification and Additional Erasing of Subsets of Memory Cells," Dec. 6, 2006.

Notice of Allowance and Fee(s) Due, United States Patent & Trademark Office, U.S. Appl. No. 11/296,071 entitled, "Systems for Soft Programming Non-Volatile Memory Utilizing Individual Verification and Additional Soft Programming of Subsets of Memory Cells," Dec. 5, 2006.

Notice of Allowance and Fee(s) Due, United States Patent & Trademark Office, U.S. Appl. No. 11/296,071 entitled, "Systems for Soft Programming Non-Volatile Memory Utilizing Individual Verification and Additional Soft Programming of Subsets of Memory Cells," Apr. 9, 2007.

Office Action, Non-Final, United States Patent & Trademark Office, U.S. Appl. No. 11/025,620 entitled, "Word Line Compensation in Non-Volatile Memory Erase Operations," Mar. 31, 2006.

Supplemental Notice of Allowability, United States Patent & Trademark Office, U.S. Appl. No. 11/025,620 entitled, "Word Line Compensation in Non-Volatile Memory Erase Operations," Mar. 26, 2007.

Office Action, Non-Final, United States Patent & Trademark Office, U.S. Appl. No. 11/025,620 entitled, "Word Line Compensation in Non-Volatile Memory Erase Operations," Jul. 13, 2007.

International Preliminary Report on Patentability (Chapter 1 of the Patent Cooperation Treaty), Patent Cooperation Treaty, Application No. PCT/US2005/045557 filed on Dec. 15, 2005, Jul. 12, 2007.

Non-final Office Action, United States Patent & Trademark Office, U.S. Appl. No. 11/296,055 filed on Dec. 6, 2005, Oct. 2, 2007.

Notice of Allowance and Fee(s) Due, United States Patent & Trademark Office, U.S. Appl. No. 11/295,755 filed on Dec. 6, 2005, Feb. 25, 2008.

* cited by examiner

Erase Potential = $V_{erase} - V_{FG}$ = 20V − 10V = 10V
(non-programmed cell)

Erase Potential = $V_{erase} - V_{FG}$ = 20V − 11V = 9V

|  | t0 | t1 | t2 |
|---|---|---|---|
| Bit Line | Floating | Floating | Floating |
| SGD | Floating | Floating | Floating |
| WLn | 0V | 0V | 0V |
| WLn-1 | 0V | Floating | 0V |
| . | 0V | Floating | 0V |
| . | 0V | Floating | 0V |
| WLi | 0V | Floating | 0V |
| . | 0V | Floating | 0V |
| . | 0V | Floating | 0V |
| WL1 | 0V | Floating | 0V |
| WL0 | 0V | 0V | 0V |
| SGS | Floating | Floating | Floating |
| Source Line | Floating | Floating | Floating |
| P-well | $V_{erase}$ | $V_{erase}$ | $V_{erase}$ |

Erase Potential = $V_{erase} - V_{FG}$ = 20V − 11V = 9V

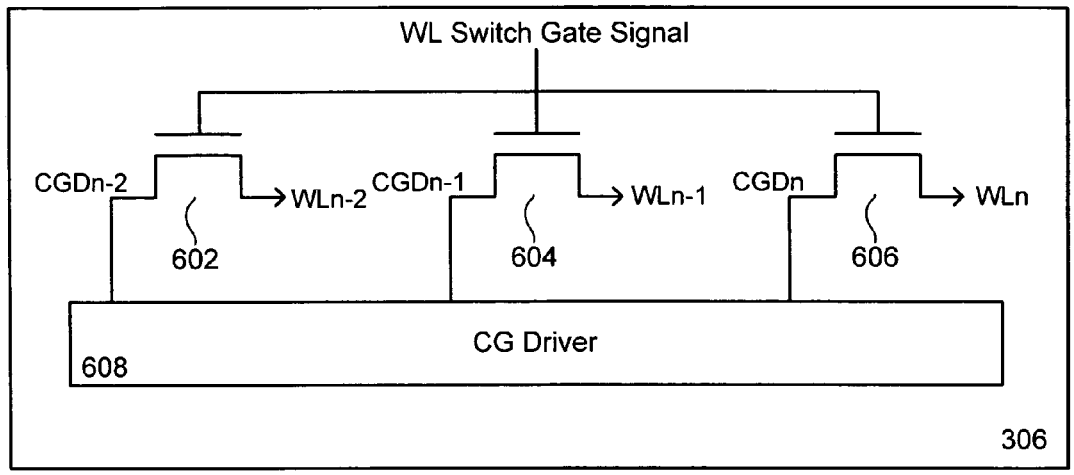
Fig. 21
Fig. 22
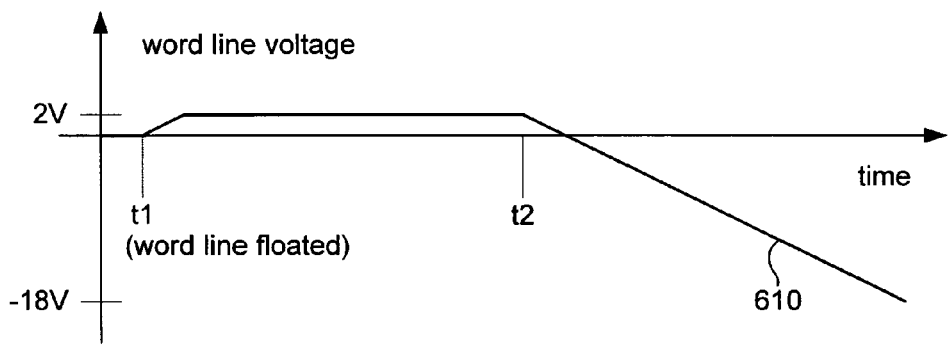
Fig. 23
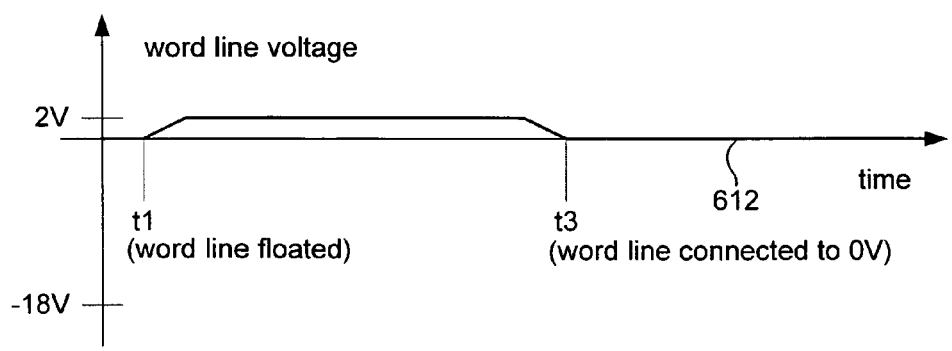

SYSTEMS FOR ERASING NON-VOLATILE MEMORY UTILIZING CHANGING WORD LINE CONDITIONS TO COMPENSATE FOR SLOWER ERASING MEMORY CELLS

PRIORITY CLAIM

The present application claims priority from U.S. Provisional Patent Application No. 60/667,043, entitled "NON-VOLATILE MEMORY ERASE OPERATIONS WITH OVER-ERASE PROTECTION," by Hemink et al., filed Mar. 31, 2005, incorporated by reference herein in its entirety.

CROSS-REFERENCE TO RELATED APPLICATIONS

The following applications are cross-referenced and incorporated by reference herein in their entireties:

U.S. patent application Ser. No. 11/295,755, entitled, "ERASING NON-VOLATILE MEMORY UTILIZING CHANGING WORD LINE CONDITIONS TO COMPENSATE FOR SLOWER ERASING MEMORY CELLS,"by Masaaki Higashitani, filed concurrently;

U.S. patent application Ser. No. 11/025,620, entitled, "WORD LINE COMPENSATION IN NON-VOLATILE MEMORY ERASE OPERATIONS," by Wan et al., filed Dec. 29, 2004;

U.S. patent application Ser. No. 11/296,055, entitled, "ERASING NON-VOLATILE MEMORY USING INDIVIDUAL VERIFICATION AND ADDITIONAL ERASING OF SUBSETS OF MEMORY CELLS," by Hemink et al., filed concurrently;

U.S. patent application Ser. No. 11/296,028, entitled, "SYSTEMS FOR ERASiNG NON-VOLATILE MEMORY USING INDIVIDUAL VERIFICATION AND ADDITIONAL ERASING OF SUBSETS OF MEMORY CELLS, "by Hemink et al., filed concurrently;

U.S. patent application Ser. No. 11/295,747, entitled, "SOFT PROGRAMMING NON-VOLATILE MEMORY UTILIZING INDIVIDUAL VERIFICATION AND ADDITIONAL SOFT PROGRAMMING OF SUBSETS OF MEMORY CELLS,"by Hemik et al., filed concurrently; and U.S. patent application Ser. No. 11/296,071, entitled, "SYSTEMS FOR SOFT PROGRAMMING NON-VOLATILE MEMORY UTILIZING INDIVIDUAL VERIFICATION AND ADDITIONAL SOFT PROGRAMMING OF SUBSETS OF MEMORY CELLS,"by Hemink et al., filed concurrently.

BACKGROUND OF THE INVENTION

1. Field of the Invention

The present invention relates generally to semiconductor technology for erasing non-volatile memory devices.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM), including flash EEPROM, and Electronically Programmable Read Only Memory (EPROM) are among the most popular non-volatile semiconductor memories.

One example of a flash memory system uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first select gate 120 and a second select gate 122. Select gate 120 connects the NAND string to bit line 126. Select gate 122 connects the NAND string to source line 128. Select gate 120 is controlled by applying appropriate voltages to control gate 120CG via selection line SGD. Select gate 122 is controlled by applying the appropriate voltages to control gate 122CG via selection line SGS. Each of the transistors 100, 102, 104 and 106 includes a control gate and a floating gate, forming the gate elements of a memory cell. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, etc. The discussion herein is not limited to any particular number of memory cells in a NAND string.

A typical architecture for a flash memory system using a NAND structure will include several NAND strings. For example, FIG. 3 shows three NAND strings 202, 204 and 206 of a memory array having many more NAND strings. Each of the NAND strings of FIG. 3 includes two select transistors or gates and four memory cells. For example, NAND string 202 includes select transistors 220 and 230, and memory cells 222, 224, 226 and 228. NAND string 204 includes select transistors 240 and 250, and memory cells 242, 244, 246 and 248. Each string is connected to the source line by one select gate (e.g. select gate 230 and select gate 250). A selection line SGS is used to control the source side select gates. The various NAND strings are connected to respective bit lines by select gates 220, 240, etc., which are controlled by select line SGD. In other embodiments, the select lines do not necessarily need to be in common. Word line WL3 is connected to the control gates for memory cell 222 and memory cell 242. Word line WL2 is connected to the control gates for memory cell 224 and memory cell 244. Word line WL1 is connected to the control gates for memory cell 226 and memory cell 246. Word line WL0 is connected to the control gates for memory cell 228 and memory cell 248. As can be seen, a bit line and respective NAND string comprise a column of the array of memory cells. The word lines (WL3, WL2, WL1 and WL0) comprise the rows of the array. Each word line connects the control gates of each memory cell in the row. For example, word line WL2 is connected to the control gates for memory cells 224, 244 and 252.

Each memory cell can store data (analog or digital). When storing one bit of digital data, the range of possible threshold voltages of the memory cell is divided into two ranges which are assigned logical data "1" and "0." In one example of a NAND type flash memory, the threshold voltage is negative after the memory cell is erased, and defined as logic "1." The threshold voltage after a program operation is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored. A memory cell can also store multiple levels of information, for example, multiple bits of digital data. In the case of storing multiple levels of data, the range of possible threshold voltages is divided into the number of levels of data. For example, if four levels of information are stored, there will be four threshold voltage ranges assigned to the data values "11", "10", "01", and "00." In one example of a NAND type memory, the threshold voltage after an erase operation is negative and defined as "11." Three different positive threshold voltages are used for the states of "10", "01", and "00."

Relevant examples of NAND type flash memories and their operation are provided in the following U.S. Patents/Patent Applications, all of which are incorporated herein by reference: U.S. Pat. No. 5,570,315; U.S. Pat. No. 5,774,397, U.S. Pat. No. 6,046,935, U.S. Pat. No. 6,456,528 and U.S. Pat. Application. Ser. No. 09/893,277 (Publication No. US2003/0002348).

When programming a flash memory cell, a program voltage is applied to the control gate (via a selected word line) and the bit line is grounded. Electrons from the p-well are injected into the floating gate. When electrons accumulate in the floating gate, the floating gate becomes negatively charged and the threshold voltage of the cell is raised. The floating gate charge and threshold voltage of the cell can be indicative of a particular state corresponding to stored data.

In order to erase memory cells of a NAND type flash memory, electrons are transferred from the floating gate of each memory cell to the well region and substrate. Typically, one or more high voltage (e.g., ~16V-20V) erase pulses are applied to the well region to attract electrons away from the floating gate of each memory cell to the well region. The word lines of each memory cell are grounded or supplied with 0V to create a high potential across the tunnel oxide region to attract the electrons. If each memory cell of a NAND string is not erased after application of an erase voltage pulse, the size of the pulse can be increased and reapplied to the NAND string until each memory cell is erased.

Typical erase operations using prior art techniques can lead to differing erase rates amongst memory cells in a NAND string. Some memory cells may reach a target threshold voltage level for an erased state faster or slower than others. This can lead to over-erasure of faster erasing memory cells because they will continue to be subjected to erase voltages that are applied to sufficiently erase the slower memory cells of the NAND string. Thus, the different erase rates can result in a shorter cycling life of a memory cell or NAND string. Typical erase operations can also lead to disparate threshold voltages among memory cells of a NAND string. That is, one or more memory cells of the NAND string may have a different threshold voltage after application of one or more erase voltage pulses when compared to other memory cells of the string or device. To overcome this effect, soft programming has been used to adjust the threshold voltages of one or more memory cells after erasure. For example, a relatively low program voltage—lower than used for actual programming—may be applied to one or more memory cells to raise their threshold voltages in order to narrow and/or raise the threshold voltage distribution of the population of erased memory cells. Soft programming, however, may increase program and erase times. Moreover, the different erase rates can result in a shorter cycling life of a memory string.

Accordingly, there is a need for a non-volatile memory system and related erase technique that can address the aforementioned problems of prior art erase techniques.

SUMMARY OF THE INVENTION

The present invention, roughly described, pertains to technology for erasing memory devices in a manner that provides a more efficient and consistent erasure of memory cells. In accordance with one embodiment, a system and method is provided that considers the individual characteristics and erase behavior of one or more memory cells of a NAND string during erase operations.

Voltage conditions applied to selected memory cells of a non-volatile memory system can be changed during erase operations in order to equalize the erase behavior of the selected memory cells with other memory cells of the system that are being concurrently erased. The changed conditions can compensate for capacitively coupled voltages within a NAND string. For example, after biasing a NAND string for an erase operation and beginning application of the erase voltage pulse, the word lines of one or more interior memory cells can be floated. By floating the selected interior word lines, the peak erase potential created across the tunnel dielectric region of the cells coupled thereto is decreased from its normal level. Consequently, the erase rates of these cells are slowed to substantially match that of the slower erasing end memory cells of the string. Different word lines can be floated at different times to alter the erase behavior of different memory cells by different amounts. The interior memory cells of a NAND string can be subdivided into various subsets for changing the applied voltage condition.

In accordance with one embodiment, a method of erasing non-volatile storage is provided that includes applying an erase voltage to a well region of a set of non-volatile storage elements and floating a control gate of each non-volatile storage element in a subset of the set of non-volatile storage elements after beginning application of the erase voltage. Floating the control gates of the elements in the subset begins while applying the erase voltage.

In accordance with another embodiment, a method of erasing non-volatile storage is provided that includes applying a first voltage signal to each non-volatile storage element in a set of non-volatile storage elements, applying an erase voltage to a well region of the set of non-volatile storage elements, and changing the first voltage signal for each non-volatile storage element in a subset of the set after beginning application of the erase voltage to the well region. Changing the first voltage signal is performed while applying the erase voltage to the well region.

In accordance with one embodiment, a non-volatile memory system is provided that includes a set of non-volatile storage elements having a well region and managing circuitry in communication with the set of non-volatile storage elements. The managing circuitry receives a request to erase the set of non-volatile storage elements and responsive to the request, applies an erase voltage to the well region. After beginning application of the erase voltage, the managing circuitry floats a control gate of each non-volatile storage element in a subset of the set of non-volatile storage elements. The managing circuitry floats the control gates while applying the erase voltage.

In accordance with another embodiment, a non-volatile memory system is provided that includes a set of non-volatile storage elements having a well region and managing circuitry in communication with the set of non-volatile storage elements. The set includes a first and a second subset of non-volatile storage elements. The first subset is interior to the second subset. The managing circuitry receives a request to erase the set and responsive to the request, applies a first voltage signal to each non-volatile storage element in the set, applies an erase voltage to the well region, and after beginning application of the erase voltage, changes the first voltage signal for each non-volatile storage element in the first subset. The managing circuitry changes the first voltage signal while applying the erase voltage to the well region.

Other features, aspects, and objects of the invention can be obtained from a review of the specification, the figures, and the claims.

BRIEF DESCRIPTION OF THE DRAWINGS

FIG. 21 is a block diagram of a row controller in accordance with one embodiment.

FIG. 22 is a graph depicting the voltage of a floated word line in one scenario.

FIG. 23 is a graph depicting the voltage of a word line that is floated then reconnected to a voltage in another scenario.

DETAILED DESCRIPTION

Figure 4:
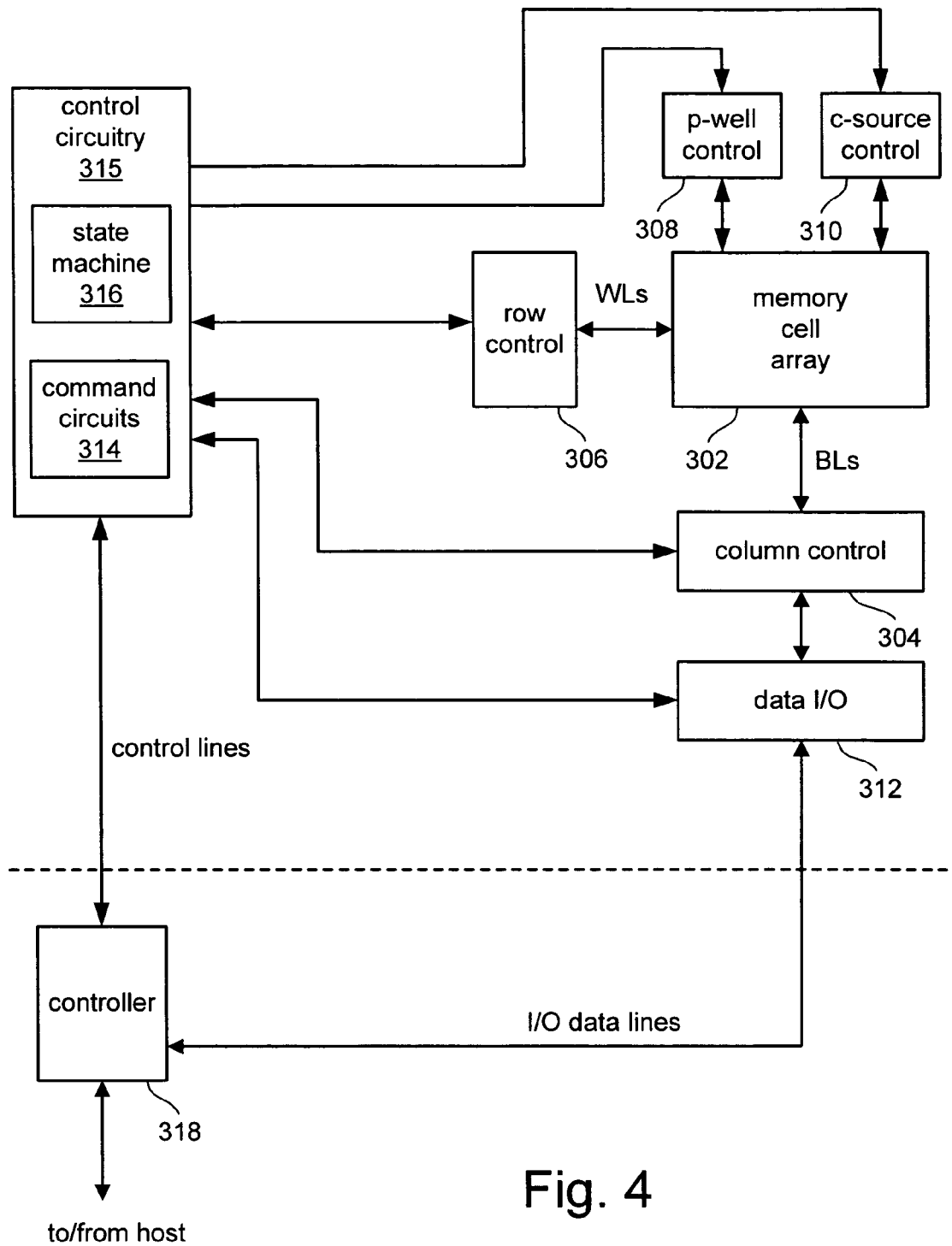
FIG. 4 is a block diagram of one embodiment of a non-volatile memory system in which the various aspects of the present invention can be implemented.

FIG. 4 is a block diagram of one embodiment of a flash memory system that can be used to implement the present invention. Other systems and implementations can be used. Memory cell array 302 is controlled by column control circuit 304, row control circuit 306, c-source control circuit 310 and p-well control circuit 308. Column control circuit 304 is connected to the bit lines of memory cell array 302 for reading data stored in the memory cells, for determining a state of the memory cells during a program operation, and for controlling potential levels of the bit lines to promote or inhibit programming and erasing. Row control circuit 306 is connected to the word lines to select one of the word lines, to apply read voltages, to apply program voltages combined with the bit line potential levels controlled by column control circuit 304, and to apply an erase voltage. C-source control circuit 310 controls a common source line (labeled as "C-source" in FIG. 6) connected to the memory cells. P-well control circuit 308 controls the p-well voltage.

The data stored in the memory cells are read out by the column control circuit 304 and are output to external I/O lines via data input/output buffer 312. Program data to be stored in the memory cells are input to the data input/output buffer 312 via the external I/O lines, and transferred to the column control circuit 304. The external I/O lines are connected to controller 318.

Command data for controlling the flash memory device is input to controller 318. The command data informs the flash memory of what operation is requested. The input command is transferred to state machine 316 which is part of control circuitry 315. State machine 316 controls column control circuit 304, row control circuit 306, c-source control 310, p-well control circuit 308 and data input/output buffer 312. State machine 316 can also output status data of the flash memory such as READY/BUSY or PASS/FAIL.

Controller 318 is connected to or connectable with a host system such as a personal computer, a digital camera, or personal digital assistant, etc. It communicates with the host that initiates commands, such as to store or read data to or from the memory array 302, and provides or receives such data. Controller 318 converts such commands into command signals that can be interpreted and executed by command circuits 314 which are part of control circuitry 315. Command circuits 314 are in communication with state machine 316. Controller 318 typically contains buffer memory for the user data being written to or read from the memory array.

One exemplary memory system comprises one integrated circuit that includes controller 318, and one or more integrated circuit chips that each contain a memory array and associated control, input/output and state machine circuits. There is a trend to integrate the memory arrays and controller circuits of a system together on one or more integrated circuit chips. The memory system may be embedded as part of the host system, or may be included in a memory card (or other package) that is removably inserted into the host systems. Such a card may include the entire memory system (e.g. including the controller) or just the memory array(s) with associated peripheral circuits (with the controller or control function being embedded in the host). Thus, the controller can be embedded in the host or included within the removable memory system.

Figure 5:
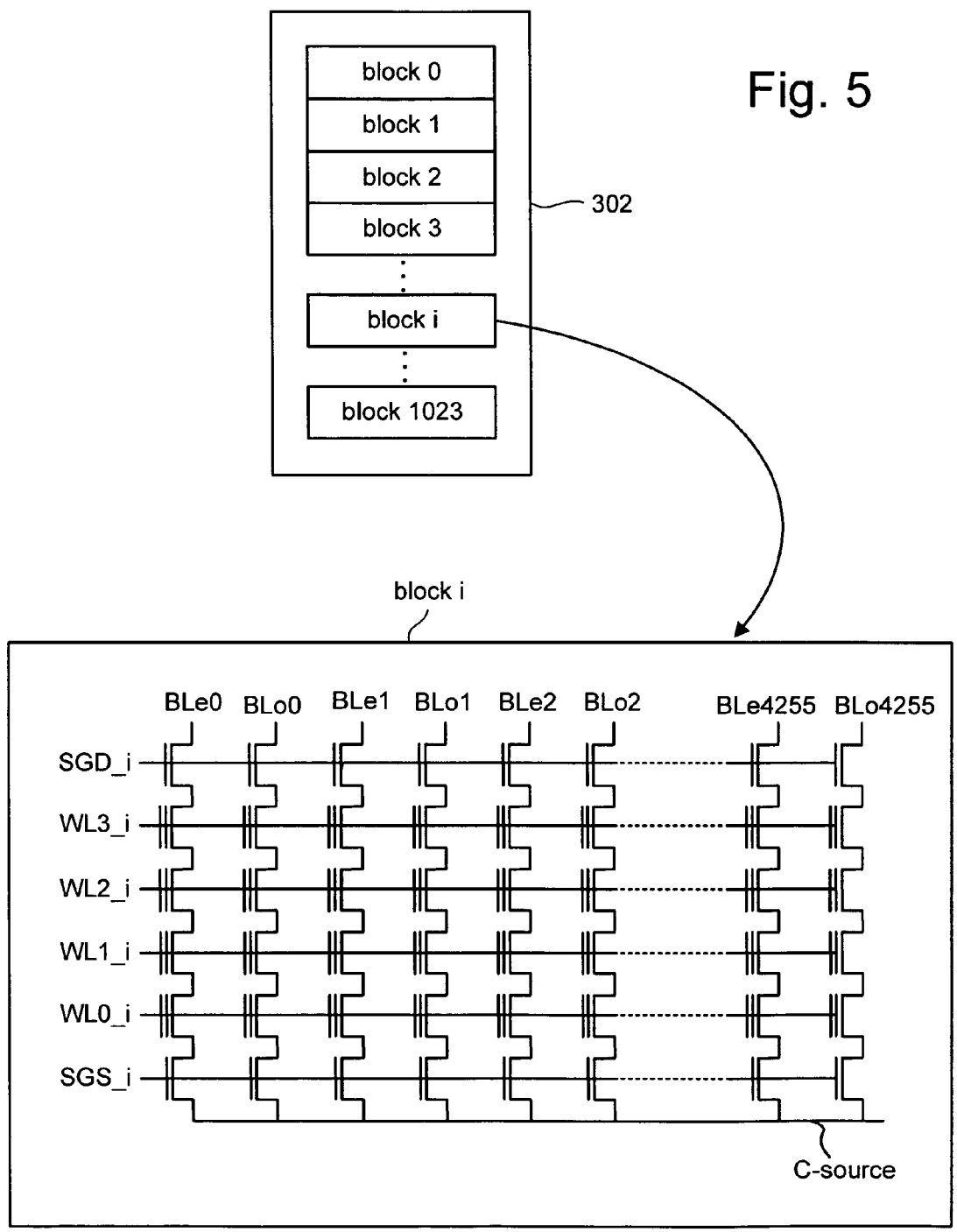
FIG. 5 illustrates an exemplary organization of a memory array.

With reference to FIG. 5, an exemplary structure of memory cell array 302 is described. As one example, a NAND flash EEPROM is described that is partitioned into 1,024 blocks. The data stored in each block can be simultaneously erased. In one embodiment, the block is the minimum unit of cells that are simultaneously erased. In each block, in this example, there are 8,512 columns. Each block is typically divided into a number of pages which can be a unit of programming. Other units of data for programming are also possible and contemplated. In one embodiment, individual pages may be divided into segments and the segments may contain the fewest number of cells that are written at one time as a basic programming operation. One or more pages of data are typically stored in one row of memory cells.

Figures 10, 11:
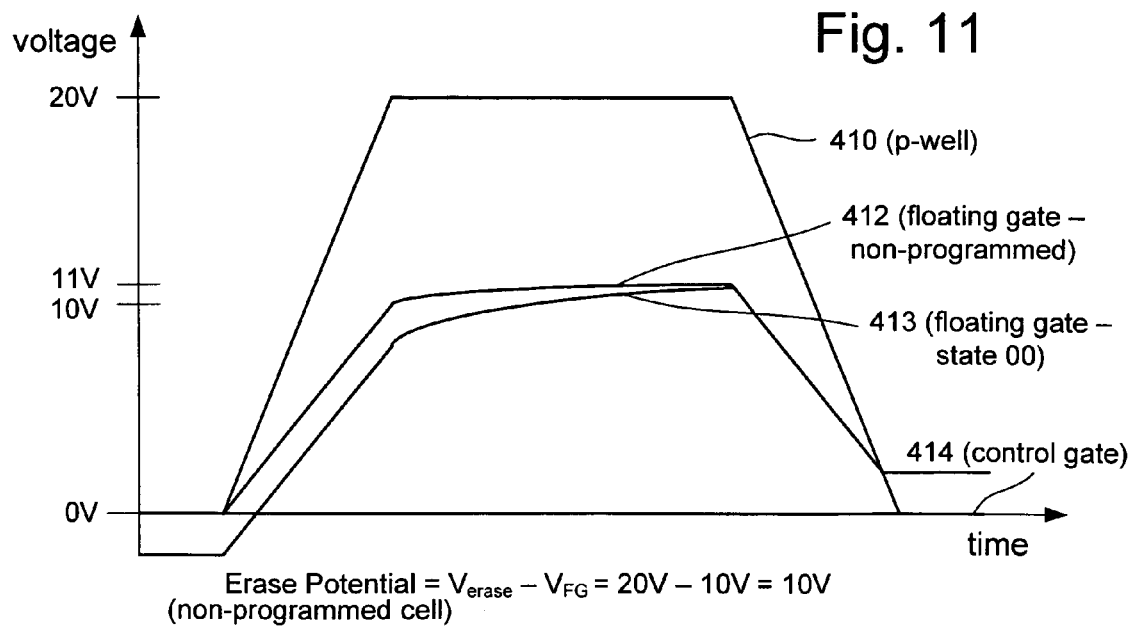
FIG. 10 is a table depicting exemplary bias conditions for performing an erase operation according to prior art techniques.
FIG. 11 is a graph depicting voltages at various portions of a NAND string during an ideal erase operation.

In each block of the example in FIG. 10 there are 8,512 columns that are divided into even columns and odd columns. The bit lines are divided into even bit lines (BLe) and odd bit lines (BLo). In an odd/even bit line architecture, memory cells along a common word line and connected to the odd bit lines are programmed at one time, while memory cells along a common word line and connected to even bit lines are programmed at another time. FIG. 5 shows four memory cells connected in series to form a NAND string. Although four cells are shown to be included in each NAND string, more or less than four can be used (e.g., 16, 32, or another number). One terminal of the NAND string is connected to a corresponding bit line via a first select transistor or gate (connected to select gate drain line SGD), and another terminal is connected to c-source via a second select transistor (connected to select gate source line SGS).

In other embodiments, the bit lines are not divided into odd and even bit lines. Such architectures are commonly referred to as all bit line architectures. In an all bit line architecture, all the bit lines of a block are simultaneously selected during read and program operations. Memory cells along a common word line and connected to any bit line are programmed at the same time.

During read and programming operations of one embodiment, 4,256 memory cells are simultaneously selected. The memory cells selected have the same word line (e.g. WL2-i), and the same kind of bit line (e.g. even bit lines). Therefore, 532 bytes of data can be read or programmed simultaneously. These 532 bytes of data that are simultaneously read or programmed form a logical page. Therefore, in this example, one block can store at least eight pages. When each memory cell stores two bits of data (e.g. a multi-level cell), one block stores 16 pages. Other sized blocks and pages can also be used with embodiments. Additionally, architectures other than that of FIGS. 4 and 5 can also be used to implement embodiments.

In the read and verify operations, the select gates of a selected block are raised to one or more select voltages and the unselected word lines (e.g., WL0, WL1 and WL3) of the selected block are raised to a read pass voltage (e.g. 4.5 volts) to make the transistors operate as pass gates. The selected word line of the selected block (e.g., WL2) is connected to a reference voltage, a level of which is specified for each read and verify operation in order to determine whether a threshold voltage of the concerned memory cell is above or below such level. For example, in a read operation of a one bit memory cell, the selected word line WL2 is grounded, so that it is detected whether the threshold voltage is higher than 0V. In a verify operation of a one bit memory cell, the selected word line WL2 is connected to 0.8V, for example, so that as programming progresses it is verified whether or not the threshold voltage has reached 0.8V. The source and p-well are at zero volts during read and verify. The selected bit lines (BLe) are pre-charged to a level of, for example, 0.7V. If the threshold voltage is higher than the read or verify level, the potential level of the concerned bit line (BLe) maintains the high level, because of the associated non-conductive memory cell. On the other hand, if the threshold voltage is lower than the read or verify level, the potential level of the concerned bit line (BLe) decreases to a low level, for example less than 0.5V, because of the conductive memory cell. The state of the memory cell is detected by a sense amplifier that is connected to the bit line and senses the resulting bit line voltage. The difference between whether the memory cell is programmed or erased depends on whether or not net negative charge is stored in the floating gate. For example, if negative charge is stored in the floating gate, the threshold voltage becomes higher and the transistor can be in enhancement mode of operation.

When programming a memory cell in one example, the drain and the p-well receive 0 volts while the control gate receives a series of programming pulses with increasing magnitudes. In one embodiment, the magnitudes of the pulses in the series range from 12 volts to 24 volts. In other embodiments, the range of pulses in the series can be different, for example, having a starting level of higher than 12 volts. During programming of memory cells, verify operations are carried out in the periods between the programming pulses. That is, the programming level of each cell of a group of cells being programmed in parallel is read between each programming pulse to determine whether or not it has reached or exceeded a verify level to which it is being programmed. One means of verifying the programming is to test conduction at a specific compare point. The cells that are verified to be sufficiently programmed are locked out, for example in NAND cells, by raising the bit line voltage from 0 to Vdd (e.g., 2.5 volts) for all subsequent programming pulses to terminate the programming process for those cells. In some cases, the number of pulses will be limited (e.g. 20 pulses) and if a given memory cell is not sufficiently programmed by the last pulse, an error is assumed. In some implementations, memory cells are erased (in blocks or other units) prior to programming.

Figure 6:
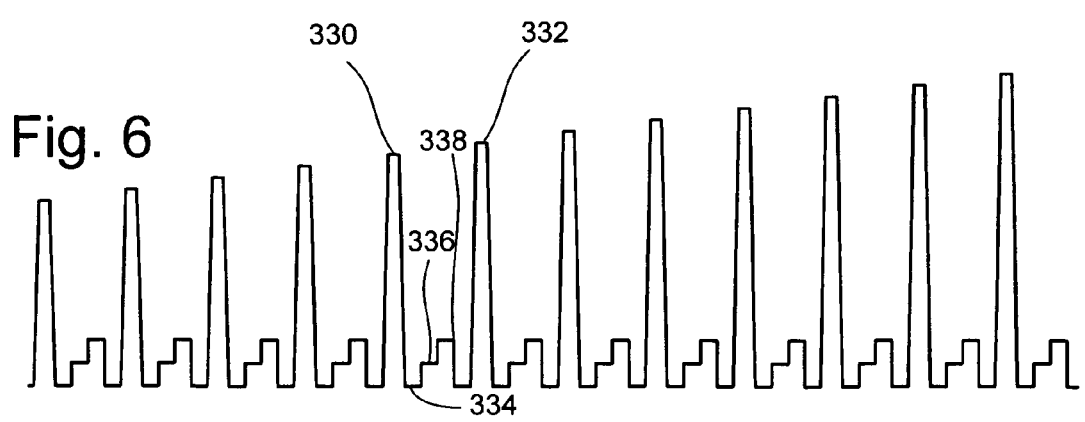
FIG. 6 depicts an exemplary program/verify voltage signal that can be applied to a selected word line in accordance with embodiments.

FIG. 6 depicts a program voltage signal in accordance with one embodiment. This signal has a set of pulses with increasing magnitudes. The magnitude of the pulses is increased with each pulse by a predetermined step size. In one embodiment that includes the memory cells storing multiple bits of data, an exemplary step size is 0.2 volts (or 0.4 volts). Between each of the program pulses are the verify pulses. The signal of FIG. 6 assumes a four state memory cell, therefore, it includes three verify pulses. For example, between programming pulses 330 and 332 are three sequential verify pulses. The first verify pulse 334 is depicted at a zero volt verify voltage level. The second verify pulse 336 follows the first verify pulse at the second verify voltage level. The third verify pulse 338 follows the second verify pulse 336 at the third verify voltage level. A multi-state memory cell capable of storing data in eight states may need to perform verify operations at seven compare points. Thus, seven verify pulses are applied in sequence to perform seven verify operations at seven verify levels between two consecutive programming pulses. Based on the seven verify operations, the system can determine the state of the memory cells. One means for reducing the time burden of verifying is to use a more efficient verify process, for example, as disclosed in U.S. patent application Ser. No. 10/314,055, entitled "Smart Verify for Multi-State Memories," filed Dec. 5, 2002; U.S. patent application Ser. No. 11/260658 entitled "Method for Programming of Multi-State Non-Volatile Memory Using Smart Verify, filed Oct. 27, 2005; and U.S. patent application Ser. No. 11/259799, entitled "Apparatus for Programming of Multi-State Non-Volatile Memory Using Smart Verify," filed Oct. 27, 2005, all of which are incorporated herein by reference in their entirety.

The read and verify operations described above are performed according to techniques known in the art. Thus, many of the details explained can be varied by one skilled in the art.

Figure 7:
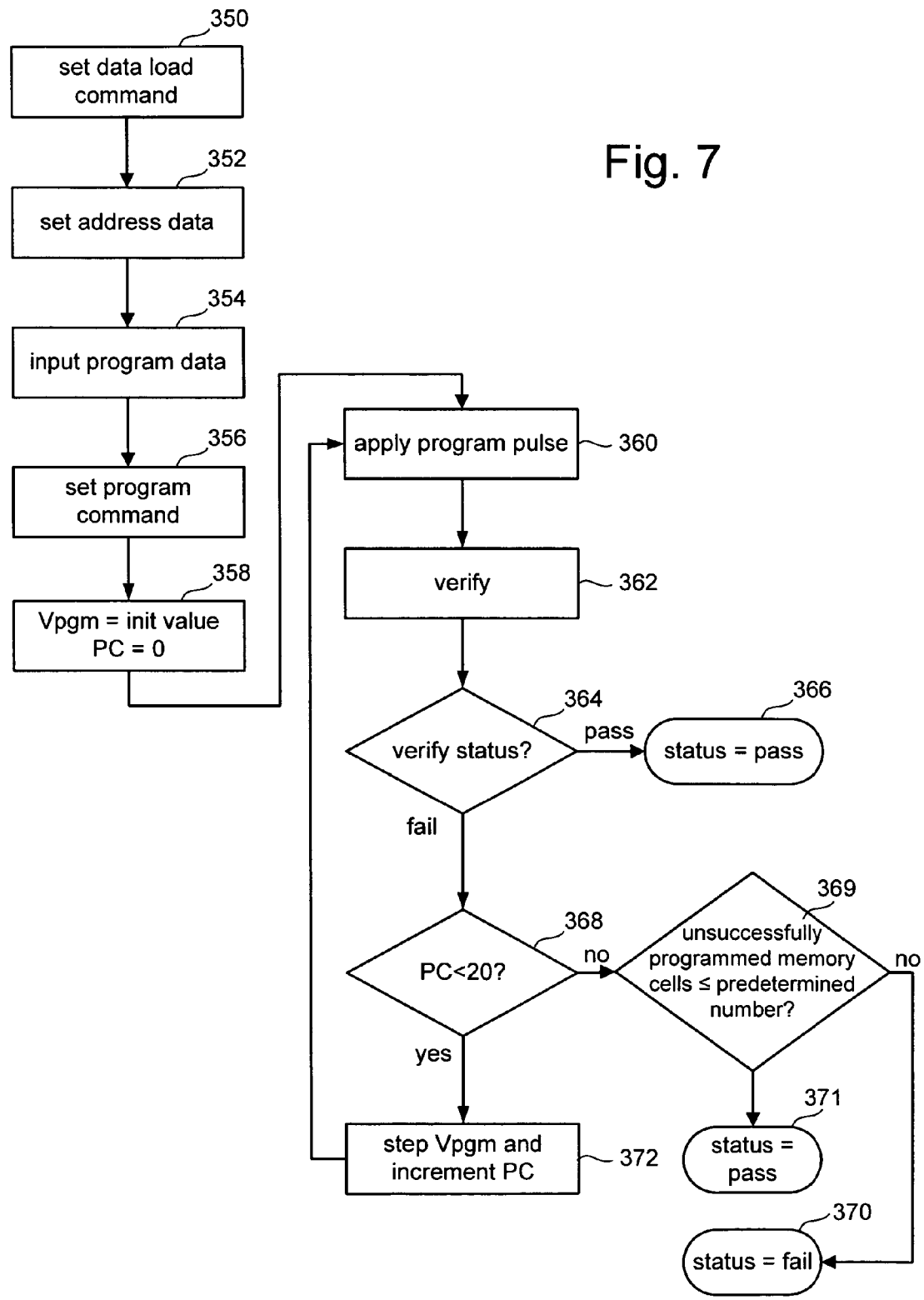
FIG. 7 is an exemplary flowchart for performing a program operation.

FIG. 7 is a flow chart describing one embodiment of a method for programming non-volatile memory. In one implementation, memory cells are erased (in blocks or other units) and optionally soft programmed prior to programming. At step 350 of FIG. 7, a "data load" command is issued by controller 318 and input to command circuits 314, allowing data to be input to data input/output buffer 312. The input data is recognized as a command and latched by state machine 316 via a command latch signal, not illustrated, input to command circuits 304. At step 352, address data designating the page address is input to row controller or decoder 306 from the controller or host. The input data is recognized as the page address and latched via state machine 316, affected by the address latch signal input to command circuits 314. At step 354, a page of program data for the addressed page is input to data input/output buffer 312 for programming. For example, 532 bytes of data could be input in one embodiment. That data is latched in the appropriate registers for the selected bit lines. In some embodiments, the data is also latched in a second register for the selected bit lines to be used for verify operations. At step 356, a "program" command is issued by the controller and input to data input/output buffer 312. The command is latched by state machine 316 via the command latch signal input to command circuits 314.

Triggered by the "program" command, the data latched in step 354 will be programmed into the selected memory cells controlled by state machine 316 using the stepped pulses of FIG. 6 applied to the appropriate word line. At step 358, Vpgm, the programming pulse voltage level applied to the selected word line, is initialized to the starting pulse (e.g., 12V) and a program counter PC maintained by state machine 316 is initialized at 0. At step 360, the first Vpgm pulse is applied to the selected word line. If logic "0" is stored in a particular data latch indicating that the corresponding memory cell should be programmed, then the corresponding bit line is grounded. On the other hand, if logic "1" is stored in the particular latch indicating that the corresponding memory cell should remain in its current data state, then the corresponding bit line is connected to Vdd to inhibit programming.

At step 362, the states of the selected memory cells are verified. If it is detected that the target threshold voltage of a selected cell has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine knows that all selected cells have been programmed. At step 364, it is checked whether all of the data latches are storing logic "1." If so, the programming process is complete and successful because all selected memory cells were programmed and verified to their target states. A status of "PASS" is reported at step 366.

If, at step 364, it is determined that not all of the data latches are storing logic "1," then the programming process continues. At step 368, the program counter PC is checked against a program limit value. One example of a program limit value is 20, however, other values can be used in various implementations. If the program counter PC is not less than 20, then it is determined at step 369 whether the number of bits that have not been successfully programmed is equal to or less than a predetermined number. If the number of unsuccessfully programmed bits is equal to or less than the predetermined number, then the programming process is flagged as passed and a status of pass is reported at step 371. The bits that are not successfully programmed can be corrected using error correction during the read process. If however, the number of unsuccessfully programmed bits is greater than the predetermined number, the program process is flagged as failed and a status of fail is reported at step 370. If the program counter PC is less than 20, then the Vpgm level is increased by the step size and the program counter PC is incremented at step 372. After step 372, the process loops back to step 360 to apply the next Vpgm pulse.

The flowchart of FIG. 7 depicts a single-pass programming method as can be applied for binary storage. In a two-pass programming method as can be applied for multi-level storage, for example, multiple programming or verification steps may be used in a single iteration of the flowchart. Steps 358-372 may be performed for each pass of the programming operation. In a first pass, one or more program pulses may be applied and the results thereof verified to determine if a cell is in the appropriate intermediate state. In a second pass, one or more program pulses may be applied and the results thereof verified to determine if the cell is in the appropriate final state.

Figure 8:
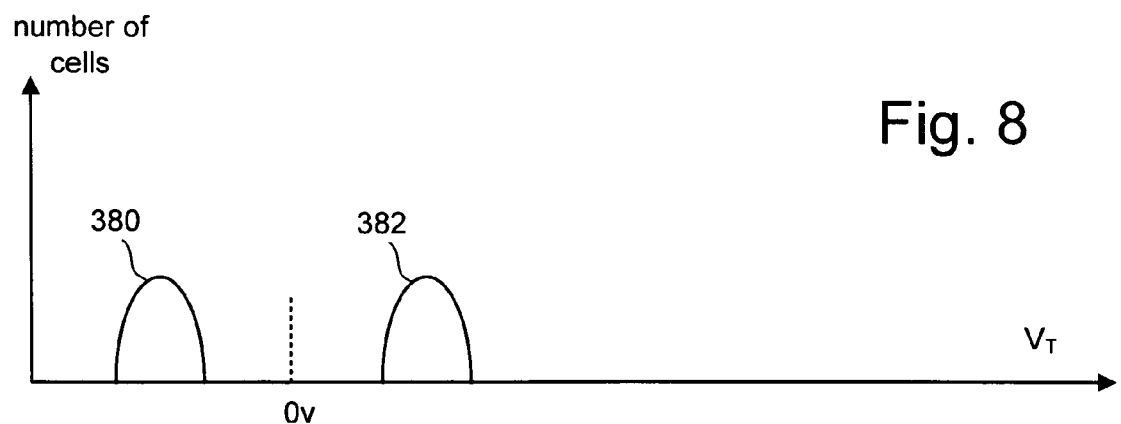
FIG. 8 depicts exemplary threshold distributions of a group of memory cells.

At the end of a successful program process, the threshold voltages of the memory cells should be within one or more distributions of threshold voltages for programmed memory cells or within a distribution of threshold voltages for erased memory cells. FIG. 8 illustrates threshold voltage distributions for a memory cell array when each memory cell stores one bit of data. FIG. 8 shows a first distribution 380 of threshold voltages for erased memory cells and a second distribution 382 of threshold voltages for programmed memory cells. In one embodiment, the threshold voltage levels in the first distribution 380 are negative and correspond to logic "1" while the threshold voltage levels in the second distribution 382 are positive and correspond to logic "0."

Figure 9:
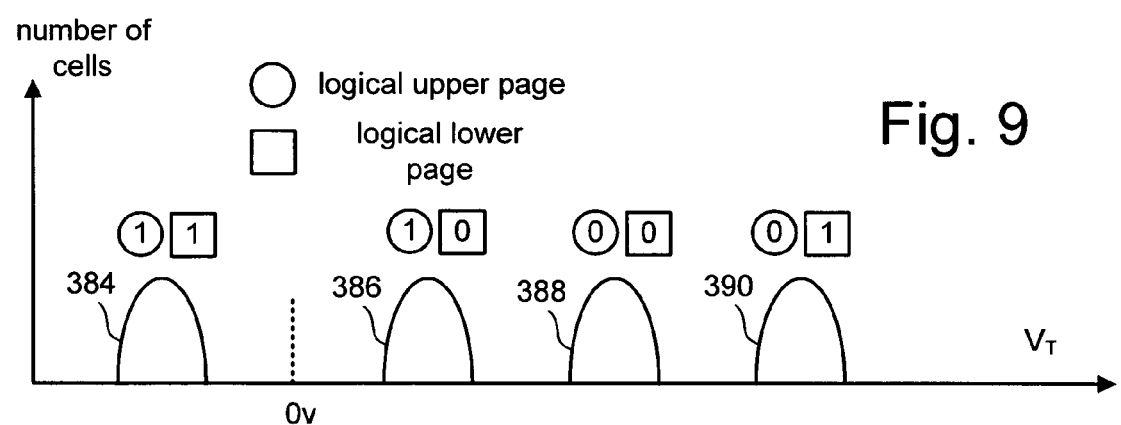
FIG. 9 depicts exemplary threshold distributions of a group of memory cells storing two bits of data.

FIG. 9 illustrates exemplary threshold voltage distributions for a memory cell array when each memory cell stores two bits of data in four physical states. Distribution 384 represents a distribution of threshold voltages of cells that are in an erased state (storing "11"), having negative threshold voltage levels. Distribution 386 represents a distribution of threshold voltages of cells that are in a first programmed state, storing "10." Distribution 388 represents a distribution of threshold voltages of cells that are in a second programmed state, storing "00." Distribution 390 represents a distribution of threshold voltages of cells that are in a third programmed state, storing "01." Each of the two bits stored in a single memory cell, in this example, is from a different logical page. That is, each bit of the two bits stored in each memory cell carries a different logical page address. The bit displayed in the square corresponds to a lower page. The bit displayed in the circle corresponds to an upper page. In one embodiment, the logical states are assigned to the sequential physical states of memory cells using a gray code sequence so that if the threshold voltage of a floating gate erroneously shifts to its nearest neighboring threshold voltage state range, only one bit will be affected. In order to provide improved reliability, it is preferable for the individual distributions to be tightened (distribution narrowed), because the tighter distribution brings a wider read margin (distance between adjacent state threshold distributions).

Of course, if the memory is operated with more than four physical states then there will be a number of threshold voltage distributions within the defined voltage threshold window of the memory cells that is equal to the number of states. Further, although specific bit patterns have been assigned to each of the distributions or physical states, different bit patterns may be assigned.

Figure 1:
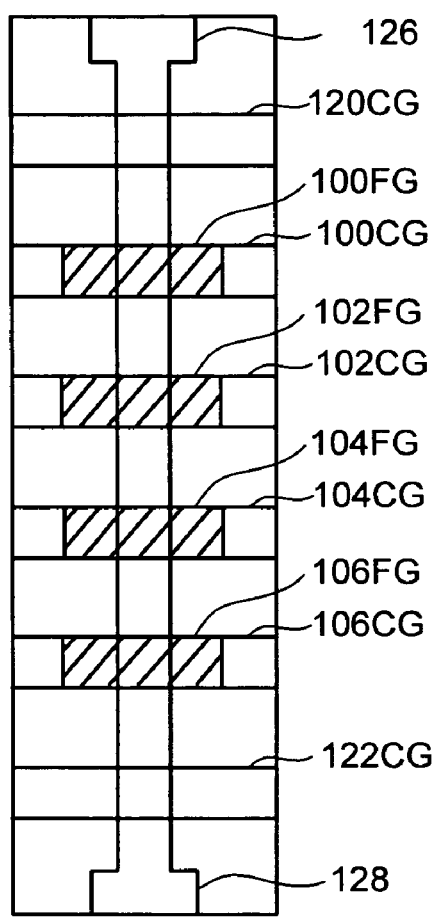
FIG. 1 is a top view of a NAND string.
Figure 2:
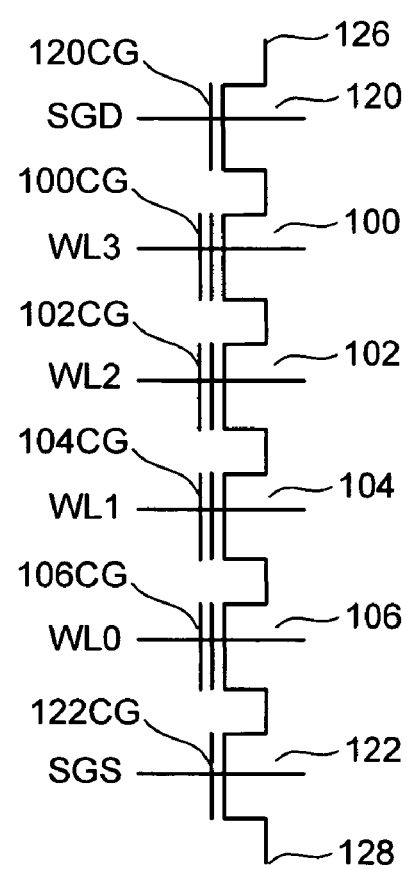
FIG. 2 is an equivalent circuit diagram of the NAND string depicted in FIG. 1.
Figure 3:
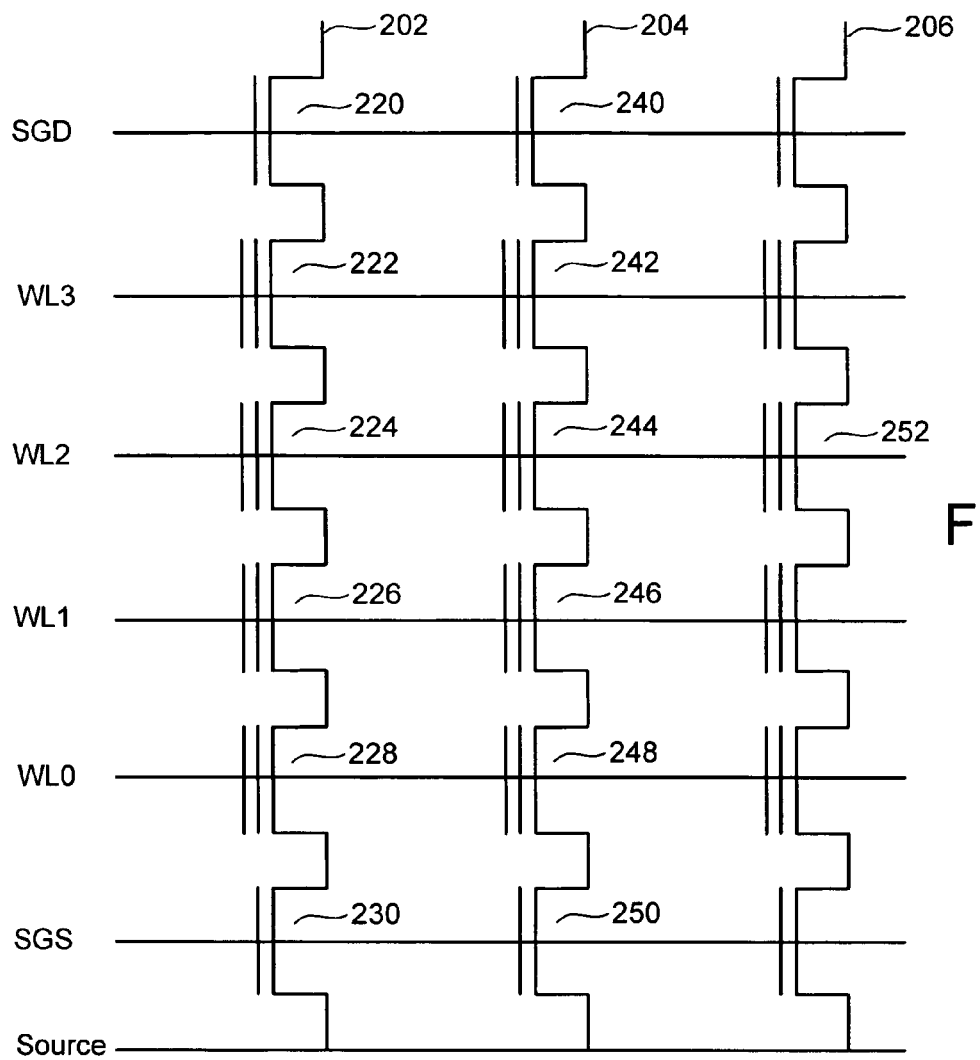
FIG. 3 is a circuit diagram depicting three NAND strings.

Normally, the cells being programmed in parallel are alternate ones along a word line. For example, FIG. 3 illustrates three memory cells 224, 244 and 252 of a much larger number of cells along one word line WL2. One set of alternate cells, including cells 224 and 252, store bits from logical pages 0 and 1 ("even pages"), while another set of alternate cells, including cell 244, store bits from logical pages 2 and 3 ("odd pages").

Memory cells are erased in one embodiment by raising the p-well to an erase voltage (e.g. 20 volts) and grounding or applying 0 volts to the word lines of a selected block while the source and bit lines are floating. FIG. 10 depicts exemplary bias conditions for performing an erase operation. Due to capacitive coupling, the unselected word lines (e.g., those in unselected, not to-be-erased blocks), bit lines, select lines, and c-source are also raised to a high positive potential (e.g., 20V). A strong electric field is thus applied to the tunnel oxide layers of memory cells of a selected block and the data of the selected memory cells is erased as electrons of the floating gates are emitted to the substrate. As sufficient electrons are transferred from the floating gate to the p-well region, the threshold voltage of a selected cell becomes negative. Erasing can be performed on the entire memory array, one or more blocks of the array, or another unit of cells. The erase voltage signal $V_{erase}$ is typically applied as a series of erase voltage pulses, with an erase verification operation being carried out in between each pulse. If the unit of cells being erased is not verified as erased after application of an erase voltage pulse, another erase voltage pulse can be applied to the p-well region. In some embodiments, the peak value of the erase voltage is increased for each subsequent pulse (e.g., in 1V increments from 16V to 20V).

FIG. 11 is graph depicting the voltage at various portions of a NAND string during application of a single erase voltage pulse for a typical erase operation (e.g., under the bias condition of FIG. 10). The example of FIG. 11 illustrates an ideal case, ignoring inter-gate capacitive charge coupling as discussed below. Curve 410 depicts the voltage of the p-well region which receives erase voltage signal $V_{erase}$. The erase voltage pulse causes the p-well to ramp up to 20V and then back to 0V. Curve 414 depicts the control gate voltage of a memory cell of the string. Curves 412 and 413 depict the floating gate voltage of a non-programmed and programmed memory cell, respectively. Before the erase voltage pulse is applied, the floating gate voltage depends on the programmed state of the memory cell. For example, the floating gate voltage may be around −1V when the memory cell is in the first programmed state (e.g., state 10 as shown in FIG. 9), −2V when the memory cell is in the second programmed state (e.g., state 00 as shown in FIG. 9), and 0V when the memory cell is in a non-programmed state. The control gate voltage 414 remains at 0V throughout the erase operation while the floating gate voltages 412 and 413 rise in proportion to the p-well voltage. The floating gate is capacitively coupled across the tunnel dielectric region to the p-well. In many NAND string implementations, the capacitive coupling ratio between the floating gate of a memory cell and the p-well region is about 40-50%. Accordingly, floating gate voltage 412 rises in about a 0.5:1 ratio (when the coupling ratio is 50%) with the p-well voltage to a voltage of about 10V and floating gate voltage 413 rises to about 8V. The resulting erase potential, the potential between the cell's floating gate and the p-well region at the beginning of the erase voltage pulse, is given below the graph of FIG. 11. The erase potential is equal to the difference between the p-well voltage ($V_{erase}$=20V) and the floating gate voltage (e.g, $V_{FG}$=10V). For the scenario depicted in FIG. 11, the erase potential is equal to about 10V at the beginning of the first erase voltage pulse for the non-programmed cell (412) and 12V for the cell having a starting floating gate voltage of −2V (413). Note that the erase potential changes during the actual erase voltage pulse as electrons are transferred from the floating gate to the p-well. As a result, when the p-well returns to 0V after the erase voltage pulse, the floating gate voltage will be different than before the erase voltage pulse was applied. Typically, the floating gate voltage will be positive after the first erase voltage pulse, corresponding to a negative (erased) threshold voltage of the memory cell.

The actual voltage levels within a NAND string will be different than described with respect to the ideal case of FIG. 11. Because of capacitive charge coupling between neighboring floating gates and between select gates and neighboring floating gates, different memory cells of a NAND string may experience different erase potentials under application of the same erase bias conditions.

Figure 12:
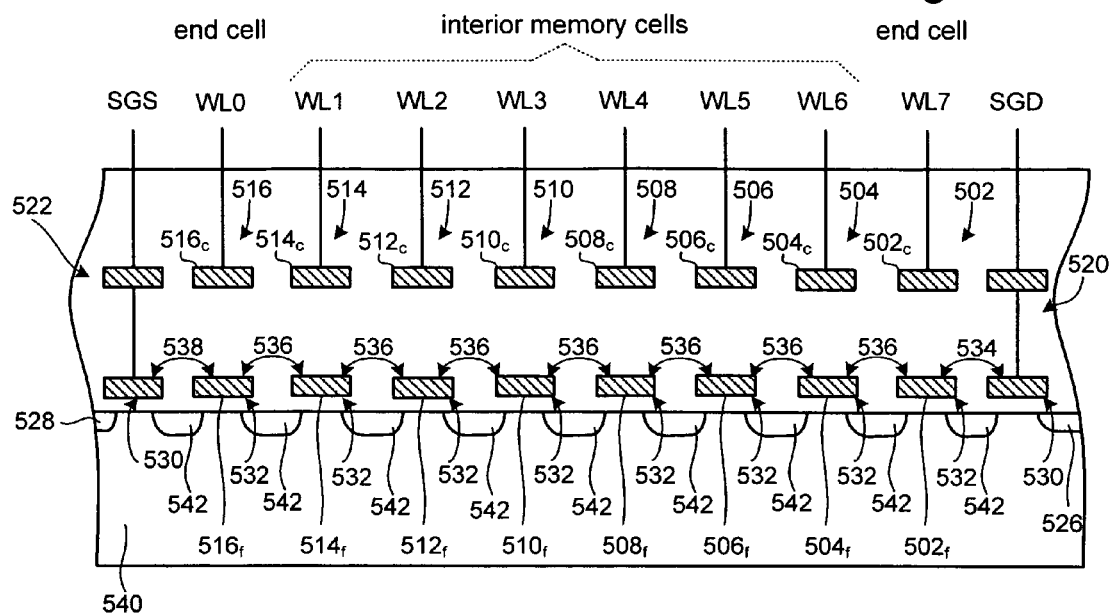
FIG. 12 is a cross sectional view of a NAND string depicting various capacitively coupled voltages within the NAND string.

FIG. 12 provides a cross-sectional view of a NAND string including 8 memory cells. Although embodiments are presented with respect to FIG. 12 and an 8 cell NAND structure, the present invention is not so limited and can be used in accordance with numerous NAND structures including fewer or more than 8 memory cells (e.g., 4, 12, 16, or more). As depicted in FIG. 12, the memory cells of the NAND string are formed in p-well region 540. Each memory cell (502, 504, 506, 508, 510, 512, 514, and 516) includes a stacked gate structure that consists of the control gate (502c, 504c, 506c, 508c, 510c, 512c, 514c, and 516c) and a floating gate (502f, 504f, 506f 512f, 514f, and 516f). The floating gates are formed on the surface of the p-well on top of an oxide or other dielectric composite film. The control gate is above the floating gate, with an oxide or other isolating dielectric layer separating the control gate and floating gate. The control gates of the memory cells connect to or form word lines WL0, WL1, WL2, WL3, WL4, WL5, WL6, and WL7. N+diffused regions 542 are shared between neighboring cells whereby the cells are connected to one another in series to form a NAND string. These N+ diffused regions form the source and drain of each of the cells. N+ diffused region 526 connects to the bit line for the NAND string, while N+ diffused region 528 connects to a common source line for multiple NAND strings. The select gates 520 and 522 are formed of the same structure as the memory cells, however, the gate regions are electrically connected.

Because of capacitive coupling, the floating select gates 522 and 520 are raised to a high positive potential when a high erase voltage is applied to the p-well during erase operations. The erase voltage applied to the p-well, or some portion thereof, couples from the well region to each of the select gates. About 90-100% of the p-well voltage can be expected to couple to each select gate in many NAND structures. Therefore, if an erase voltage pulse of 20V is applied to the p-well, the voltage on each select gate will rise about 18V-20V to a voltage of 18V-20V. In FIG. 12, the coupling from p-well 540 to select gates 522 and 520 is illustrated by arrows 530. Although to a lesser degree, a similar coupling effect is also experienced by each of the memory cells of the string. The coupling between the p-well and the floating gate of a memory cell is typically about 40-50%. Each floating gate is also coupled to its corresponding control gate with a coupling of about 50-60%. To a smaller extent, each floating gate is coupled to neighboring floating gates and control gates. All the different couplings add up to a total of 100%. Assuming a 50% coupling from p-well to floating gate, the floating gate voltage of each memory cell is raised about 10V under application of a 20V erase voltage pulse. This coupling effect is illustrated by arrows 532. The voltage coupled to each memory cell's floating gate effects the $V_{erase}$ potential created across the tunnel oxide layer. For example, an erase potential of about 10V (20V-10V) is created under application of a 20V erase voltage pulse to the p-well for a memory cell having a floating gate voltage of 0V prior to erasing.

Each memory cell of the string will experience some capacitive charge coupling from neighboring memory cells and/or transistors. This coupling can effect the potential of a cell's floating gate and consequently, the erase potential for the cell. The end memory cells (e.g., memory cells 502 and 516 in FIG. 12) of the NAND string—those connected to the first and last word lines (end word lines) of the NAND string and adjacent to the select gates of the NAND string—will experience capacitive charge coupling from the neighboring select gates. In FIG. 12, this capacitive coupling is depicted by arrow 534 from select gate 520 to floating gate 502f of memory cell 520 and by arrow 538 from select gate 522 to floating gate 516f of memory cell 516. The voltage coupled to memory cells 502 and 516 will decrease the electric field present across those cells' tunnel dielectric regions (e.g., tunnel oxide) in proportion to the amount of voltage at the respective select gate.

The coupling represented by arrows 538 and 534 occurs in both directions because during an erase operation, the select gates are in a floating state as well. As a result, the floating gate voltage of memory cells 516 and 502 will have some influence on the voltage on the select gates 522 and 520. However, the coupling from floating gate to select gate is much smaller than the coupling from the p-well to the select gates, and thus, the select gate voltage is determined almost completely by the p-well voltage.

In many NAND implementations, capacitive coupling from the select gates to the floating gates of the end memory cells of a NAND string can be expected to be on the order of about 2% to 5%. If an erase voltage of 20 volts is applied to the p-well region, each select gate's voltage will rise about 18V with 90% p-well to select gate coupling. Subsequently, due to the 2-5% coupling from select gate to neighboring floating gate, the voltage on the neighboring floating gates (e.g., 516f and 502f) will rise about 0.4-1V. The resulting voltage across the tunnel oxide of the end memory cells of the string will be about 0.4V to 1V less than that for the ideal case shown in FIG. 11. Note that the above mentioned capacitive coupling can vary largely depending on the physical dimensions of the memory cells and select gates, the spacing between memory cells and select gates, and the dielectric properties of the materials used in constructing such components as the tunnel dielectric, dielectric between control and floating gates, and dielectric between select gates and memory cells. In some cases, for example, the above mentioned coupling may be larger or smaller than the above mentioned 2-5% range.

In addition to coupling between neighboring floating gates, another factor is coupling between the floating gate and neighboring word lines or control gates. This coupling may also be on the order of 2-5%, but may be smaller or larger depending on the dimensions and shape of the memory cells. In some cases, particularly where the physical distance between the select gates and neighboring memory cells is similar to the distance between two interior memory cells, the coupling from the select gate to the neighboring floating gate will be in a similar range as the coupling from a neighboring control gate (word line) and floating gate. During an erase operation, however, as the select gate is biased differently in comparison with the control gates and floating gates, the floating gate voltage of the end memory cells will be higher than that of the interior memory cells and thus, the erase potential will be lower for the end memory cells as hereinafter described.

Figure 13:
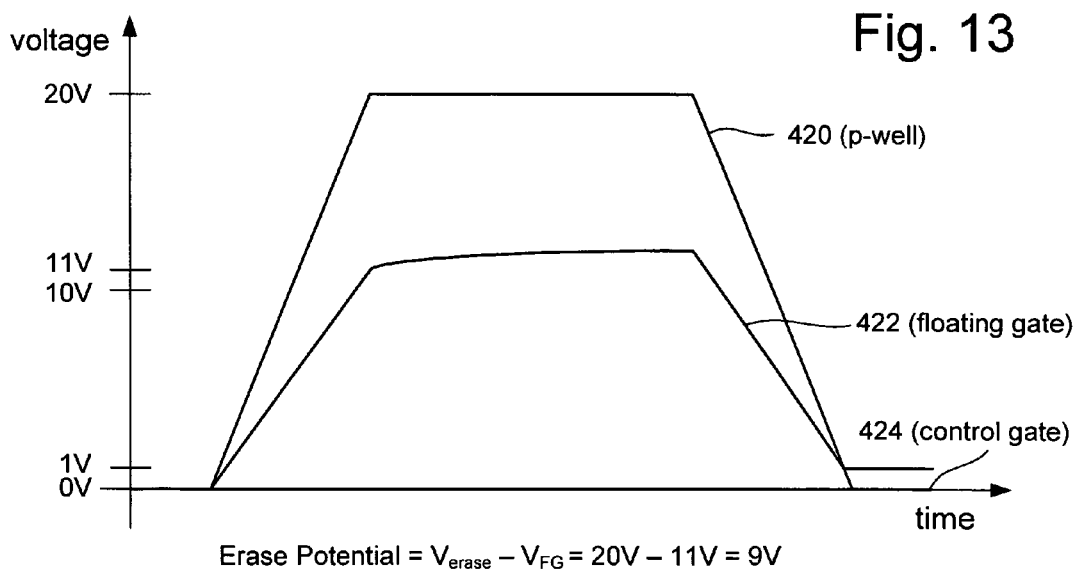
FIG. 13 is a graph depicting various voltages of the end memory cells of a NAND string during an erase operation.

FIG. 13 depicts the p-well voltage 420, floating gate voltage 422, and control gate voltage 424 for a typical end memory cell of a NAND string during application of a single erase voltage pulse for an erase operation under the bias conditions of FIG. 10. It is assumed that the floating gate voltage is 0V prior to application of the erase voltage pulse. The p-well voltage 420 rises from 0V to a peak value of 20V and then back to 0V. The control gate voltage 424 remains at 0V since the word lines connected to each memory cell are supplied with 0V. As with all the cells, the floating gates of the end memory cells are capacitively coupled to the p-well region on the order of about 40-50%. As the p-well region voltage increases to 20V, this capacitive coupling causes the floating gate voltage to rise about 10V when 50% coupling is assumed. The end memory cells additionally have a portion of the voltage at the neighboring select gate coupled to them. Thus, the voltage on these floating gates will not only be increased in proportion with the p-well voltage that is capacitively coupled thereto, but will also be increased due to the 2-5% coupling from the select gates. In FIG. 13, it is assumed that the coupling from the select gates adds an additional 1V to the floating gate voltage. Accordingly, the floating gate voltage 422 rises to a maximum value of 11V at the beginning of the erase voltage pulse as opposed to the maximum value of 10V for the ideal case depicted in FIG. 11. The erase potential across the tunnel dielectric region for the end memory cells is given below the graph of FIG. 13. The erase potential at the beginning of the erase voltage pulse is about 9V, or about 1V less than the 10V erase potential for the ideal case. If the floating gate voltage had been −2V prior to the erase voltage pulse, the floating gate voltage would rise to 9V, resulting in an erase potential of about 11V for the end memory cell, compared to the corresponding erase potential of 12V for an ideal memory cell having a starting floating gate voltage of −2V, as shown in FIG. 11 (curve 413).

The memory cells of a NAND string that are not adjacent to a select gate (i.e., all but the end memory cells of a NAND string) may be referred to herein as interior memory cells of the string. In FIG. 12, the interior memory cells of the NAND string are memory cells 504, 506, 508, 510, 512, and 514. Although the interior memory cells will experience capacitive coupling from neighboring floating gates that will decrease their erase potential (discussed hereinafter), it is of a lesser degree than that of the end memory cells. Thus, the interior memory cells will behave substantially as the ideal case described earlier and have an erase potential of 10V (assuming that the cells were in an non-programmed state with a floating gate voltage of about 0V before the erase voltage pulse). Because of the lower potential across the tunnel oxide layers of the end memory cells compared to the interior memory cells, the end memory cells will erase slower and not be as deeply erased (will have fewer electrons transferred from their floating gates) as the interior memory cells after application of one or more erase voltage pulses.

Memory cells of a NAND string are verified as erased when the charge on the floating gate is above a predetermined level (threshold voltage below a predetermined level). Because of the additional coupling to the floating gates of the end memory cells, the overall time for an erase operation is increased in order to sufficiently erase these end memory cells. The interior memory cells may be sufficiently erased after application of a number N erase voltage pulses, while the end memory cells of the NAND string may not be sufficiently erased until application of N+1 or more erase voltage pulses.

Figure 14:
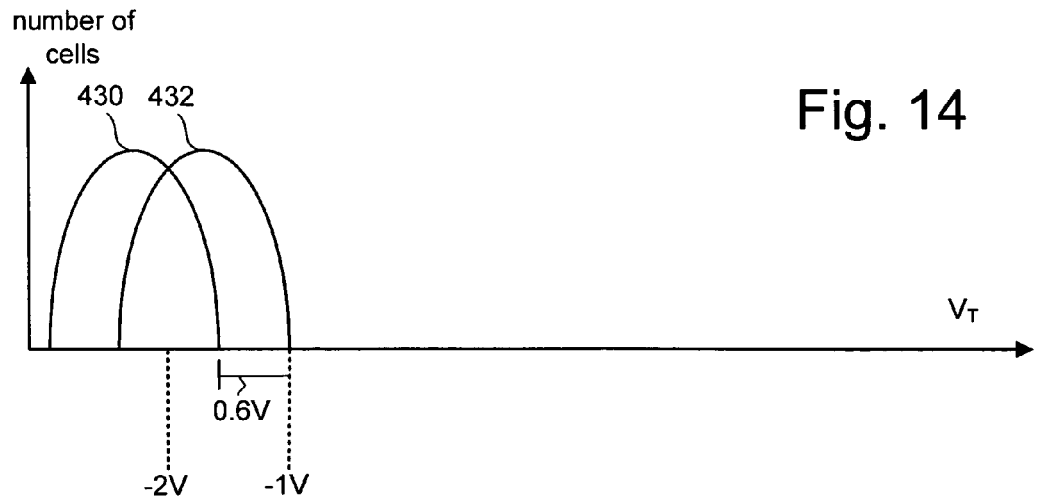
FIG. 14 depicts exemplary threshold voltage distributions of select memory cells of a NAND string after receiving an erase voltage pulse according to prior art techniques.

FIG. 14 depicts the threshold voltage distributions of a set of memory cells after application of a single erase voltage pulse (a similar distribution with lower overall VT values may exist after multiple erase voltage pulses). Distribution 430 depicts the threshold voltage distribution for the interior memory cells of a NAND string, such as the memory cells connected to WL1-WL6 in FIG. 12. Distribution 432 depicts the threshold voltage distribution for the end memory cells, such as those connected to WL0 and WL7 in FIG. 12. As illustrated, those memory cells connected to the interior word lines are deeper erased than the memory cells of the end word lines after application of just one erase voltage pulse. In some NAND memory device implementations, the interior memory cells can be expected to be about 0.5-1V deeper erased than the end memory cells in the example shown. The average threshold voltage of the interior memory cells is lower than that of the end word lines because the number of electrons transferred from the floating gates of those memory cells is more than that of the memory cells connected to the end word lines. The memory cells of both the interior and end word lines are in general erased deeper than required. To guarantee that all or most memory cells can be erased with one erase voltage pulse after a number of write/erase cycles, the selected size of the first erase voltage pulse is generally larger than required to erase all the cells of a fresh device (not having undergone many write/erase cycles) in one pulse. Thus, a fresh memory device may have threshold voltage distributions as shown in FIG. 14 after undergoing an erase operation.

Figure 15:
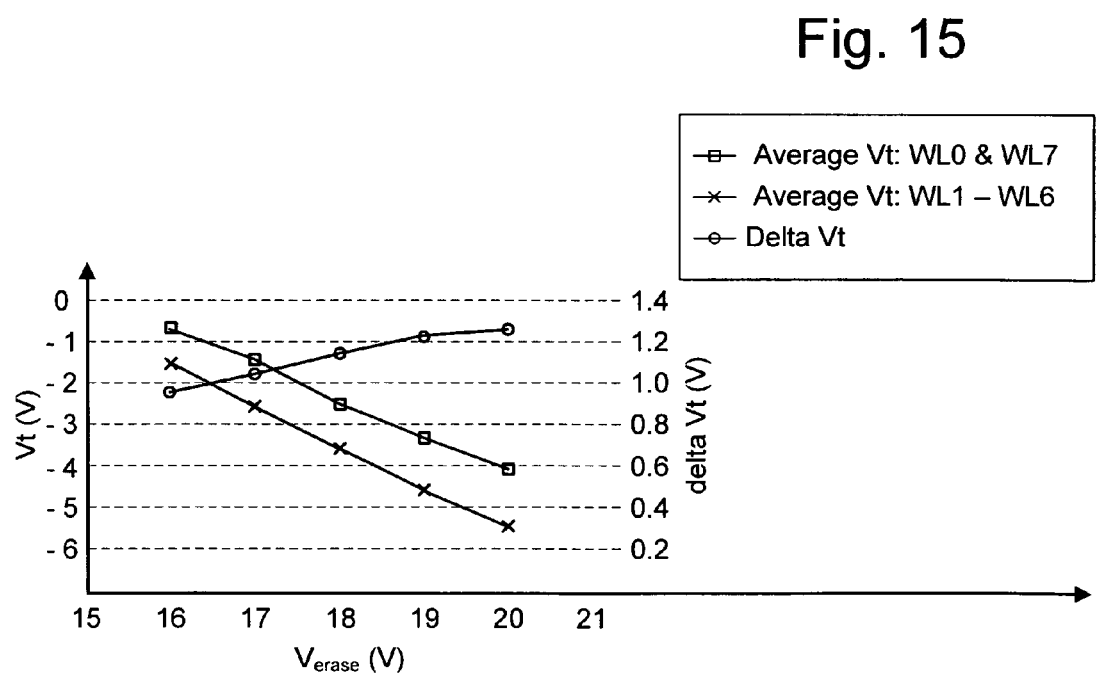
FIG. 15 is a graph depicting average threshold voltages of select memory cells of a NAND string as a function of an applied erase voltage pulse magnitude.

FIG. 15 is a graph depicting the average threshold voltage of the memory cells of a NAND string as a function of an applied erase voltage signal. After application of a 16V erase voltage pulse the average threshold voltage of a memory cell connected to WL0 or WL7 is almost −1V. The average threshold voltage of the interior memory cells, those memory cells connected to WL1-WL6, is about −1.5V. After application of a second erase voltage pulse, the average threshold voltage for WL0 and WL7 has decreased to about −1.5V while the average threshold voltage of the memory cells connected to WL1-WL6 is about −2.8V. After application of additional erase voltage pulses, the difference between the average threshold voltage of the interior memory cells and the end memory cells increases. This effect is illustrated by the third line (Delta $V_t$) in FIG. 15 which depicts the difference in average threshold voltage between the interior memory cells and the end memory cells after each erase voltage pulse.

When verification of erasure of a number of memory cells is performed at a NAND string level or higher (e.g., on a block or other unit of strings), disparate erase times or behavior amongst memory cells can lead to over stressing and over erasing certain memory cells. For example, the interior memory cells of a NAND string may be over erased while attempting to sufficiently erase the end memory cells of the string. As previously described, the interior memory cells will erase faster than the end memory cells. If verification is performed at a NAND string level, the NAND string will continue to receive an erase voltage pulse at the p-well until each memory cell of the string is erased. Therefore, even though the interior memory cells may sufficiently erase after a lower number of erase voltage pulses than the end memory cells, the interior memory cells will receive additional erase voltage pulses until each memory cell of the string is verified as erased.

A greater stress is placed on the interior memory cells than is necessary because of over erasure. Over erasing the interior memory cells because of the slower erase times of the end memory cells can decrease the life span of the interior memory cells and an overall non-volatile memory system. As understood in the art, application of a large potential across the tunnel oxide layer of a transistor stresses the oxide material. Application of a high enough potential across the tunnel oxide layer or application of a lower potential a number of times can eventually lead to a breakdown of the oxide layer.

Disparate erase behavior between memory cells can also lead to increased erase operation times because of additional operations that may be performed to change the threshold voltage of a memory cell after being erased. When flash memory cells are erased, the goal is that all erased cells have a negative threshold voltage within a predefined range of negative threshold voltages. As illustrated, however, the erase process may result in some cells having negative threshold voltages below the predefined range. Memory cells having a threshold voltage that is too low may not subsequently program properly or may cause other cells to not program properly (e.g., by increasing the probability that program disturb occurs). Thus, over-erased devices will often undergo what is called soft programming. Memory cells with threshold voltages of significantly lower values within the predefined range will receive a small amount of programming so that the threshold voltage is raised to be within the predefined range. The soft program process requires an additional operation to be performed and decreases memory performance due to increased erase times as soft programming is usually considered part of the erase operation.

In accordance with embodiments, the voltage condition applied to select memory cells of a NAND string is changed after applying the erase voltage to the p-well region during an erase operation. By changing the voltage condition for select memory cells, those selected memory cells can have their erase behavior adjusted to substantially match that of other memory cells of the NAND string. In one embodiment, 0V is applied to each word line of the NAND string. An erase voltage pulse is then applied to the p-well region. After applying the pulse, the voltage condition for the interior memory cells can be changed so that they erase slower. The condition can be changed so that the erase rate of the interior memory cells substantially matches the erase rate of the end memory cells. In one embodiment, changing the voltage condition for a memory cell can include floating the word line to which it is connected so that no electrical connection is provided thereto.

Figures 16A, 16B:
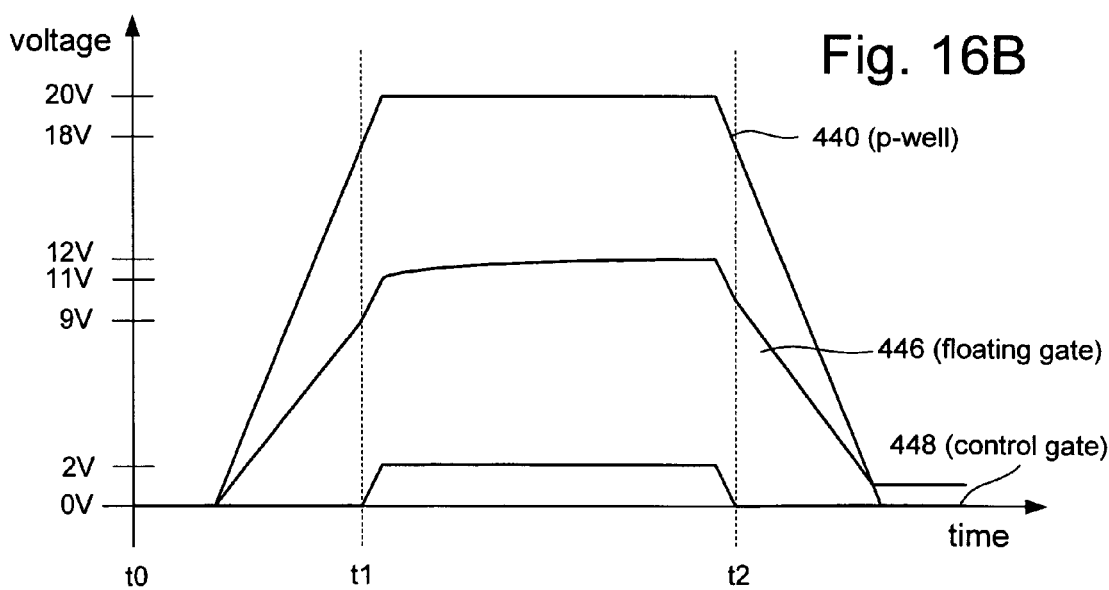
FIG. 16A is table depicting bias conditions for performing an erase operation according to one embodiment.
FIG. 16B is a graph depicting various voltages of the interior memory cells of a NAND string during an erase operation according to one embodiment.

FIG. 16A depicts the bias conditions of a technique in accordance with one embodiment for slowing down the erase rate of select memory cells to match that of other memory cells in the NAND string. FIG. 16B depicts the p-well voltage 440, floating gate voltage 446, and control gate voltage 448 of an interior memory cell during application of a single erase voltage pulse using these bias conditions. It is again assumed that the starting floating gate voltage of the memory cell is 0V. The voltages for the end memory cells will be the same as shown in FIG. 13. At time $t_0$, the NAND string is biased to begin the erase. The p-well voltage 440 subsequently rises from 0V to 20V and then decreases back to 0V. The interior word lines are at 0V until time $t_1$ so the control gate voltage 446 remains at 0V until time $t_1$. The floating gate voltage 448 rises to 9V from time $t_0$ to $t_1$ (assuming 50% coupling to the p-well) which climbs to 18V during that time. At time $t_1$, prior to the erase pulse and the p-well reaching their peak voltage, the control gates of the interior memory cells are floated by floating the word lines to which they are connected. With the word lines floating, the control gates become strongly coupled to the p-well through the floating gates. In turn, the floating gates become much more capacitively coupled to the p-well region. With the word line floating, the control gate and floating gate of a cell will be about 100% capacitively coupled to the p-well. At time $t_1$, the floating gate voltage for each of the interior memory cells will begin to rise in a 1:1 ratio with that of the p-well voltage. As the p-well voltage increases another 2V from 18V to its peak value of 20V, the floating gate voltages will also increase by 2V to a value of 11V. The control gate voltages 448 will rise to 2V from 0V once the world lines are floating. Thus, by floating the word lines at time $t_1$, the interior memory cells' floating gates are made to rise an additional 1V over that which would be achieved were the word lines to remain at 0V as in a typical operation.

As shown under the graph of FIG. 16, the erase potential created across the tunnel dielectric region of each of the interior memory cells will now be equal to that of the end memory cells. The erase potential (equal to the applied p-well voltage minus the floating gate voltage) is equal to the applied difference between the peak p-well voltage of 20V and the floating gate voltage of 11V. Thus, each memory cell of the NAND string will have a consistent potential of 9V created across its tunnel dielectric region. For memory cells with different starting states, the effects will be the same. For example, a memory cell having a starting floating gate voltage of −1V will have its floating gate voltage rise to 8V at time $t_1$, and then rise an additional 2V until the time the p-well voltage reaches its peak value. This will create a 10V erase potential (20V-10V), which is the same erase potential achieved for an end memory cell having a starting floating gate voltage of −1V.

In FIGS. 16A and 16B, each interior word line is again supplied with 0V at time $t_2$ to reduce the capacitive coupling between the p-well region and the floating gate. The control gate voltage 448 will return to 0V. Likewise, the floating gate voltage 446 will now track the decrease in the p-well voltage according to the 50% coupling ratio, rather than the 100% coupling ratio. Reapplying 0V to the interior word lines at time $t_2$ is not necessary in all embodiments. In some embodiments, the word lines are again applied with 0V so that a large voltage is not present at any transistors within the row controller for the device. In certain implementations this may not be necessary. Additionally, the time at which 0V is again applied to the word line can vary by embodiment. More details regarding reapplying 0V to the interior word lines will be described with respect to FIGS. 21-23.

In one embodiment, changing the voltage condition for the interior word lines includes applying a positive compensation voltage to the interior word lines to slow down the erase rate of the interior memory cells. In our example, it is desired to decrease the erase potential for the interior memory cells by about 1V. This can be accomplished by applying a positive voltage to the interior word lines. In some implementations, about 50% of the voltage applied to the word line during erase will couple to the connected cell's floating gate. Thus, if a 2V positive compensation voltage is applied to the interior word lines, the erase potential can be reduced by about 1V. In another embodiment, the end word lines can have their voltage condition changed to speed up their erase rates. In this case, a negative compensation voltage can be applied to the end word lines. A portion of this negative voltage will couple to the end memory cells' floating gates, thus increasing their erase potential and erase rate. For more details regarding the direct application of compensation voltages, see U.S. patent application Ser. No. 11/125,620, entitled, "WORD LINE COMPENSATION IN NON-VOLATILE MEMORY ERASE OPERATIONS," filed Dec. 29, 2004, incorporated by reference herein in its entirety.

Figure 17:
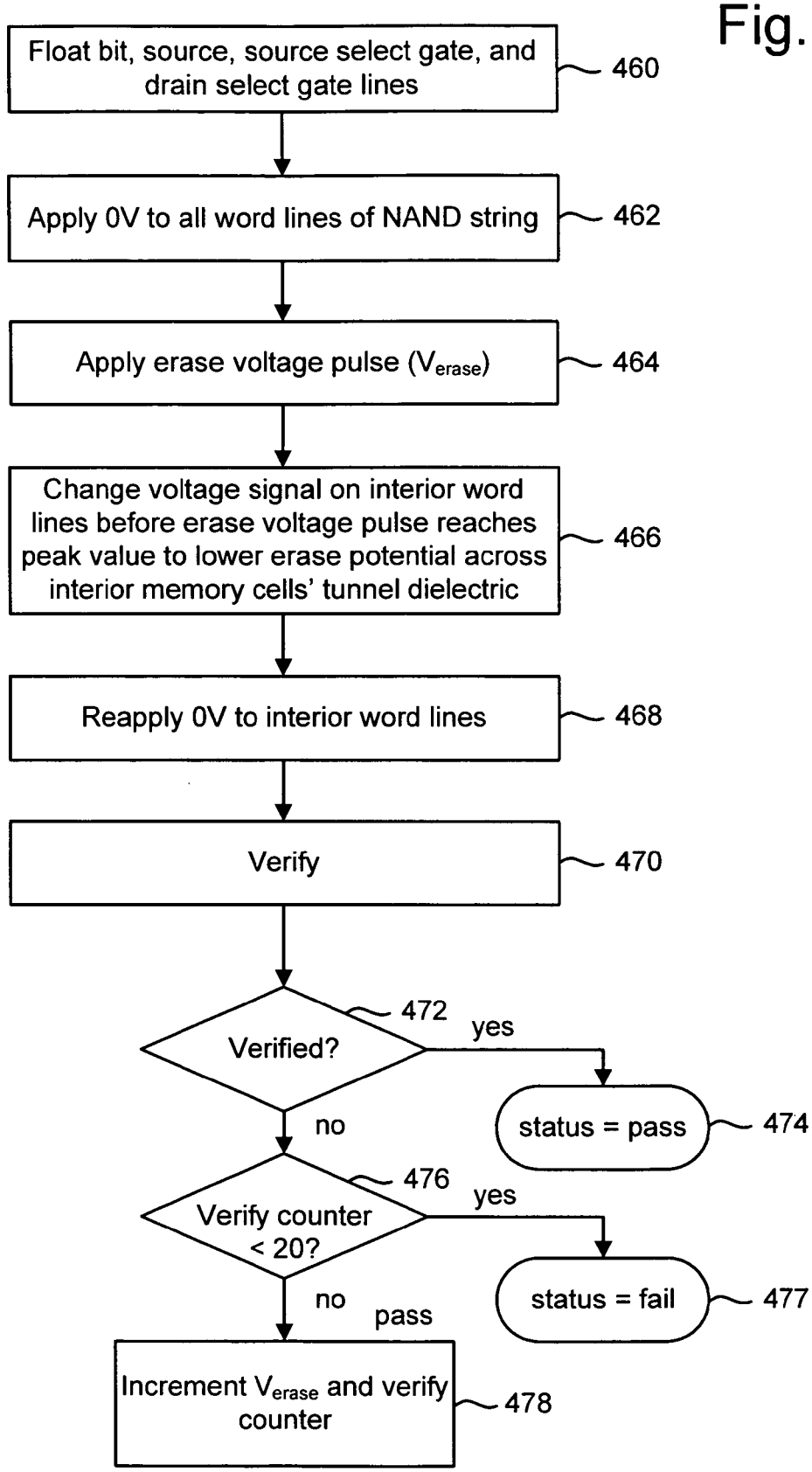
FIG. 17 is a flowchart for erasing a NAND string in accordance with one embodiment.

FIG. 17 is a flow chart in accordance with one embodiment for erasing a NAND string where the voltage condition for select memory cells is changed during the operation to equalize the erase behavior of those cells with other memory cells of the NAND string. Although FIG. 17 will be described in terms of a single NAND string, it will be understood by one of ordinary skill in the art that operation of a flow chart can be performed, such as in parallel, on multiple NAND strings in order to erase a larger unit of memory cells (e.g., one or more blocks). At step 460, the bit, source, source select gate, and drain select gate lines of the NAND string are floated. At step 462, 0V is applied to each word line of the NAND string. At step 464, an erase voltage pulse is applied to the p-well region of the NAND string. At step 466, the voltage signal applied to the interior word lines of the NAND string is changed. The signal is changed prior to the erase voltage pulse reaching its peak value to lower the resulting erase potential. Step 466 can include floating the word lines of the interior memory cells so that their floating gates are capacitively coupled to the p-well region. Floating the word lines will effectively limit the potential created between these cells' floating gates and the p-well to the level it is at when the lines are floated. At step 468, 0V is reapplied to the interior word lines. As previously described, step 468 may not be necessary in all embodiments. Verification is performed at step 470 to determine whether the NAND string has been sufficiently erased. Numerous means can be used in accordance with embodiments to verify the results of an erase operation. For example, the NAND string may be read in order to determine that the threshold voltage of each of the memory cells of the string is below a specified value. In one embodiment, this can include applying a voltage sufficient to turn on an erased memory cell to the gate of each memory cell and testing conduction of the NAND string in a direction such as from the source to bit line. More details regarding erase and erase verification can be found in co pending U.S. patent application Ser. No. 10/857,245, entitled "COMPREHENSIVE ERASE VERIFICATION FOR NON-VOLATILE MEMORY," incorporated herein by reference in its entirety, which describes a more comprehensive erase verification technique.

If the results of the verification at step 470 are successful as determined at step 472, a status of pass is reported for the NAND string at step 474. If, however, it is not determined that the NAND string is sufficiently erased at step 472, a verify counter is checked against a predetermined value at step 476. If the verify counter is less than the predetermined value (e.g., 20) then the erase voltage pulse level ($V_{erase}$) is incremented by a predetermined value and the verify counter is increased by 1 at step 478. Operation of the flow chart then continues to step 460 to set the NAND string up for application of an additional erase voltage pulse having the increased peak value. If the verify counter is greater than the predetermined number at step 476, a status of fail is reported for the NAND string at step 477

Figure 18:
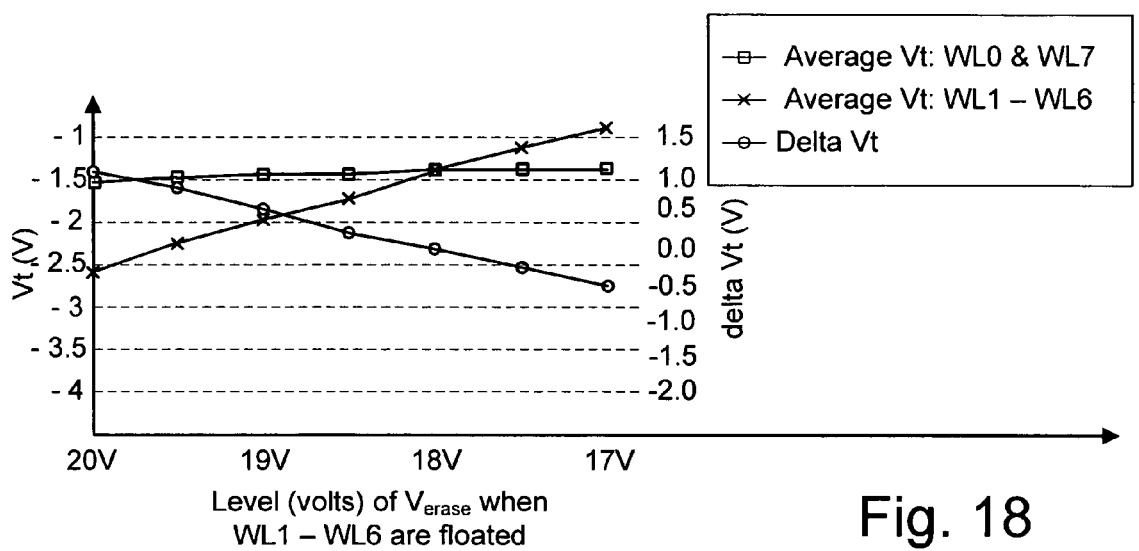
FIG. 18 is a graph depicting exemplary average threshold voltages of select memory cells of a NAND string after being erased according to one embodiment.

FIG. 18 is a graph depicting the average threshold voltage of the memory cells of a NAND string, such as depicted in FIG. 12, when utilizing a changing voltage condition as described in FIGS. 16 and 17. The actual values depicted in FIG. 18 are exemplary only and do not necessarily correspond to the examples previously discussed. The graph depicts the threshold voltage (Y axis) as a function of the value of $V_{erase}$ when the interior word lines are floated (X axis). Word lines WL0 and WL7 remain at 0V in each scenario and thus exhibit a near constant voltage regardless of when the interior memory cells are floated. After applying an erase voltage pulse, the average threshold voltage of the memory cells of WL0 and WL7 is about −1.5 volts. If the interior word lines are not floated at all (or are floated after $V_{erase}$ reaches its peak value of 20V), the average threshold voltage of the interior memory cells after application of a single erase voltage pulse is about −2.6 volts. If the interior word lines are floated when $V_{erase}$ is 19V (thus decreasing the erase potential for the interior memory cells by 0.5V), the average threshold voltage for the memory cells of WL1-WL6 increases after application of the erase voltage pulse to about −2 volts. The average threshold voltage for the memory cells of WL1-WL6 continues to increase by floating the interior word lines sooner (i.e., when $V_{erase}$ is smaller). If the interior word lines are floated when $V_{erase}$ equals 18V (thus decreasing the erase potential by 1V), the average threshold voltage is increased to about −1.5V. This is the same value for the end memory cells of the NAND string. Thus, if the interior word lines are floated when $V_{erase}$ equals 18V, they will erase at about the same rate as the end memory cells of the NAND string. If the interior word lines are floated any sooner (when $V_{erase}$ is even smaller), the interior memory cells will begin to erase slower than the end memory cells.

In this manner, over erasure of the interior memory cells is avoided by slowing their erasure rate to meet that of the end memory cells of the NAND string. The effect of this is to normalize or make substantially equal the threshold voltage distributions of the end memory cells and the interior memory cells of the NAND string. Application of the floating technique set forth in FIGS. 16 and 17 will effectively shift the erased threshold voltage distribution of the interior memory cells in the positive direction. For example, distribution 430 of FIG. 14 will be shifted to the right to substantially match that of distribution 432. In addition to minimizing or eliminating the over erasure of select memory cells, application of these techniques can minimize or eliminate the need for soft programming. Because the distributions of each memory cell will be normalized due to the floating word lines during a portion of the erase voltage pulse, there may be no need to soft program select memory cells. This can decrease the time to erase and consequently program a memory system.

In addition or alternatively to capacitively coupled voltages from select gates to the end word lines of a NAND string, there are additional capacitively coupled voltages that can be taken into consideration to more precisely compensate for voltages coupled from adjacent or neighboring transistors. FIG. 12 illustrates an additional capacitive coupling effect between the floating gates of individual memory cells of the NAND string by arrows 536. For example, the coupling between neighboring floating gates on WL0 and WL1 may be on the order 2-5%, but may be smaller or larger depending on the dimension and shape of the memory cells. As a result, a voltage present on the floating gate of memory cell 516 will influence the voltage of the floating gate of memory cell 514 and vice versa. A similar coupling effect will be present between the floating gates of memory cells 514 and 512, connected to WL2, and so on. This coupling exists in both directions, as indicated by the double head on arrows 536. These coupling effects will be seen among all memory cells of the NAND string at various levels but the impact of the coupling will be less than that on the end memory cells as the bias voltages on the neighboring control gates and floating gates are different from the bias condition on the select gates. During the presence of the erase voltage pulse, the voltage of each floating gate is significantly less than the voltage present at the select gates. Thus, the amount of voltage induced in each floating gate due to coupling between the floating gates of individual memory cells will be less than the voltage that is induced in the floating gates of the end memory cells due to the coupling to the adjacent select gates. Nevertheless, each memory cell of the NAND string can be expected to have a slightly differing net charge present at its floating gate and a correspondingly different erase behavior due to such coupling.

In accordance with one embodiment, the interior memory cells or word lines of a NAND string are divided into subsets of one or more memory cells. The individual subsets of the interior memory cells will have the voltage signal applied thereto changed at differing times in order to further normalize the erase behavior of each of these memory cells. The further a memory cell is from the select gates, or put another way, the more interior a memory cell is, the less it will be affected by capacitively coupled voltages from neighboring floating gates. The end memory cells will have about 2-5% of the voltage at the select gate (~$V_{erase}$ peak value) coupled to them. The cells adjacent to the end memory cells will have about 2-5% of this coupled voltage coupled to them, and so on. As the amount of charge capacitively coupled to a memory cell's floating gate decreases, the speed at which the cell erases increases. Thus, the more interior a memory cell is, the sooner its word line should be floated in order to slow down its erase behavior to match that of the end memory cells which have the most positive charge coupling.

Figure 19:
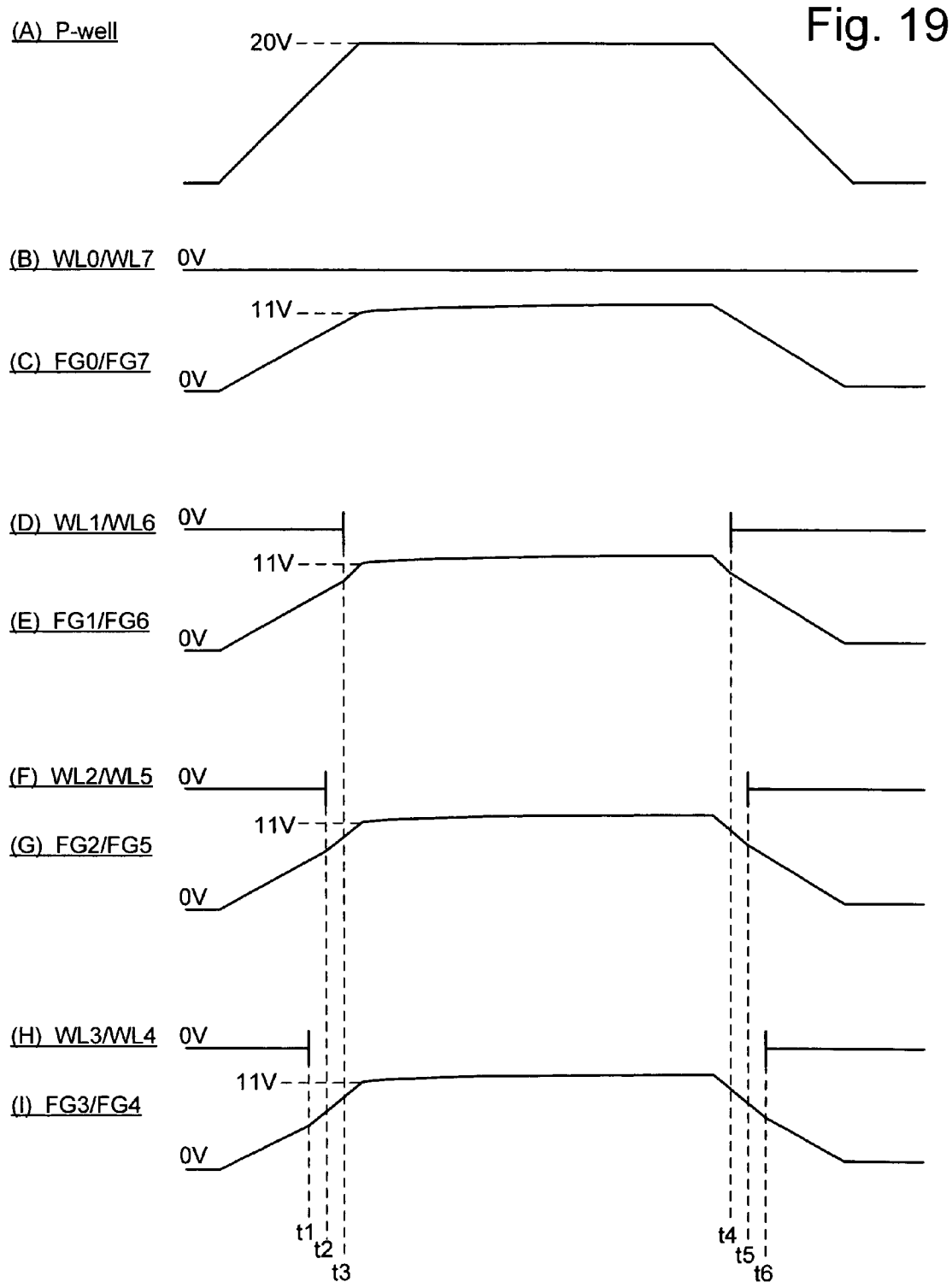
FIG. 19 is a timing diagram depicting various signals applied to a NAND string during an erase operation according to one embodiment and the resulting floating gate potential of the memory cells of the NAND string.

FIGS. 19A-19I depict a method in accordance with one embodiment for floating the interior word lines of a NAND string at different times in order to normalize the erase behavior of each interior memory cell to match that of the end memory cells. FIG. 19A depicts the p-well voltage which rises from 0V to 20V in accordance with the erase voltage $V_{erase}$. FIGS. 19B and 19C depict the voltage signal or condition applied to word lines WL0 and WL7, and the resulting floating gate voltages for the memory cells connected to these word lines. These are the end memory cells and do not have their word lines floated at all during application of the erase voltage pulse. The applied word line voltage remains at 0V throughout the operation. Thus, the floating gate voltage for each of these memory cells rises to 11V as shown in FIG. 13.

FIGS. 19D and 19E depict the voltage signal applied to word lines WL1 and WL6, and the resulting floating gate voltages for the memory cells connected to these word lines. Word lines WL1 and WL6 are immediately adjacent to word lines WL0 and WL7, respectively. Of all the interior memory cells, the memory cells at WL1 and WL6 will have the largest positive charge at their floating gate and thus, need the least amount of compensation in order to substantially match the end memory cells. Accordingly, WL1 and WL6 are floated at time $t_3$ which is just before the erase voltage pulse reaches its peak value. For example, these word lines may be floated when the p-well and $V_{erase}$ are at 19V. As shown in FIG. 19E, this results in the floating gate potential for the memory cells at WL1 and WL6 rising to the same level as that of the memory cells at WL0 and WL7, namely 11 volts.

FIGS. 19F and 19G depict the voltage signal applied to WL2 and WL5, and the resulting floating gate voltages for the memory cells connected to them. Because these word lines are interior to WL2 and WL6 and have less positive charge at their memory cells' floating gates, they need to be floated earlier to gain the additional capacitive coupling effect for a longer period of time. Word lines WL2 and WL5 are floated at time $t_2$, preceding time $t_3$. For example, time $t_2$ may correspond to the time of which the p-well and $V_{erase}$ reach 18V. As shown in FIG. 19G, this results in the floating gate voltage of the memory cells at WL2 and WL5 climbing from 0V to 11 V. By floating the word lines of these memory cells at time $t_2$, their erase behavior has been made to match that of the end memory cells.

FIGS. 19H and 19I depict the voltage signal applied to word lines WL3 and WL4, and the resulting floating gate voltages for the memory cells connected to them. WL3 and WL4 are the most interior word lines of the NAND string. Because they are farthest from the select gates, the charge coupled to their floating gates is the smallest. Because these memory cells have the smallest amount of positive charge coupled to their floating gate, their word lines must be floated for an even longer period of time in order to normalize their erase behavior with that of the end memory cells. Accordingly, WL3 and WL4 are floated at time $t_1$, preceding both times $t_2$ and $t_3$. For example, time $t_3$ may correspond to the time when the p-well and $V_{erase}$ reach 17V. By floating these word lines at time $t_1$. The resulting floating gate voltage for the memory cells at WL3 and WL4 will rise from 0V to 11V to match that of the end memory cells.

It will be appreciated by those of ordinary skill in the art that times $t_1$, $t_2$, $t_3$, etc., for any given NAND string implementation can be selected based on the design of that implementation. The erase voltages and coupling effects will vary in different implementations. Thus, these times will differ by embodiment. However, in each case the more interior a memory cell is, the sooner its corresponding word line should be floated in order to normalize the erase behavior of the memory cell with that of the end memory cells. FIGS. 19A through 19I also depict times $t_4$, $t_5$, $t_6$ in which 0V is again applied to each of the word lines. As previously described, reapplying 0V to the word lines may not be necessary in each embodiment. In the present case, each subset of word lines is reconnected to 0V at a time corresponding to when it was allowed to float. However, in other embodiments, each of the word lines of all interior memory cells can be reconnected to 0V at the same time or they can be reconnected at different times and in different orders than that depicted in FIG. 19. More details will be described in FIGS. 21-23.

Figure 20:
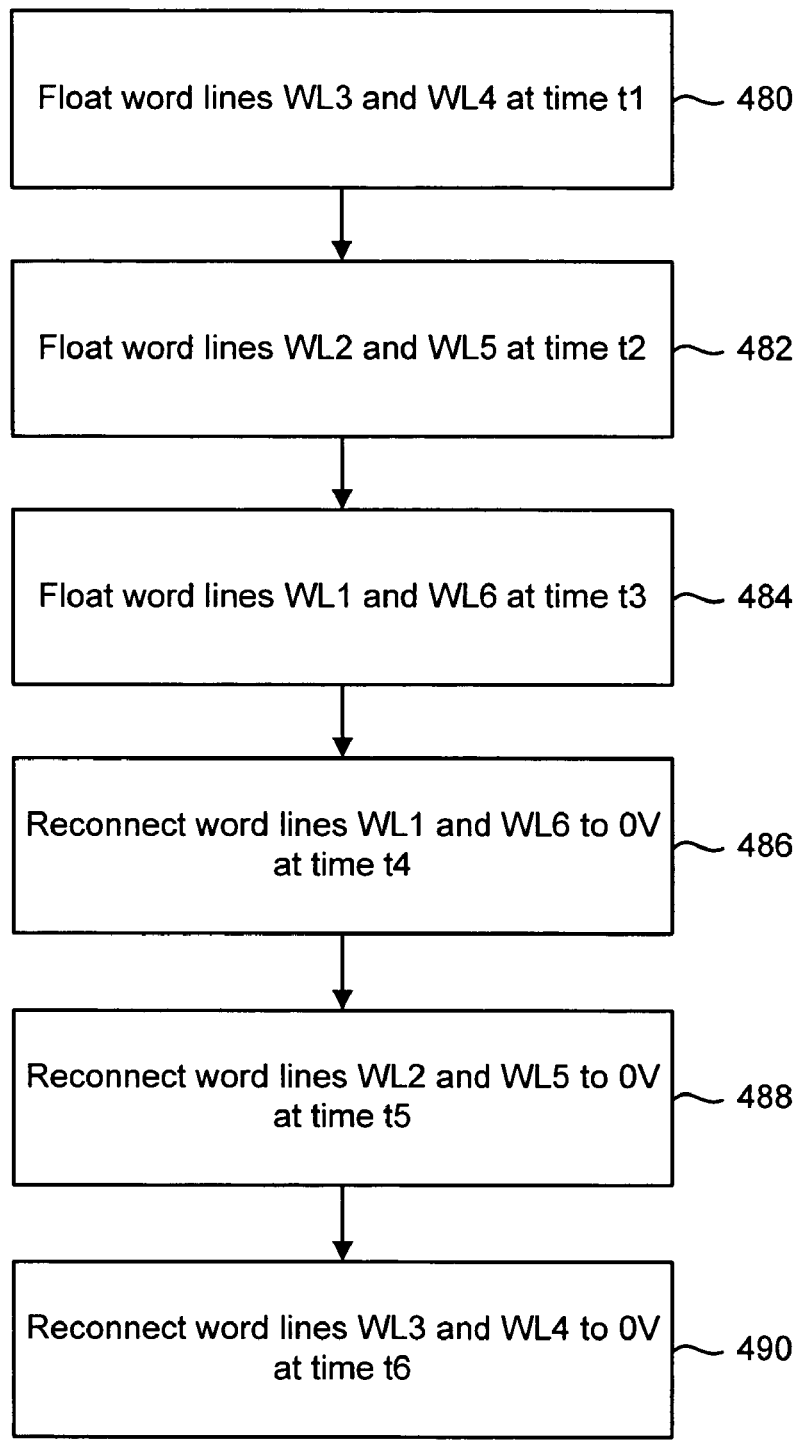
FIG. 20 is a flowchart for changing the voltage signal on selected word lines of a memory system during an erase operation according to one embodiment.

FIG. 20 is a flow chart in accordance with one embodiment where the interior word lines are divided into subsets which are floated at differing times in order to more precisely normalize their erase behavior with that of the end memory cells. It will be appreciated by those of ordinary skill in the art that the example presented in FIG. 20 is for exemplary purposes only and that other embodiments will include NAND strings having more or fewer word lines and that other configurations of the steps herein can be made. FIG. 20 corresponds to steps 466 and 468 of FIG. 17. Steps 480 through 484 correspond to step 466 where the voltage signal of the interior word lines is changed, and steps 486 though 490 correspond to step 468 where the interior word lines are reconnected to 0V.

At step 480, the most interior word lines are floated. In this example, word lines WL3 and WL4 are floated at time $t_1$. At step 482, the next most interior word lines are floated. In this example, word lines WL2 and WL5 are floated at time $t_2$. At step 484, the next most interior word lines are floated. Various alternatives can be made in accordance with embodiments. More or less than 2 word lines can be grouped together as a subset for having their word line floated at a particular time. For example, word lines WL3, WL4, WL2 and WL5 can be grouped together in one subset and floated at the same time. Thus, step 480 will include floating word lines WL2, WL3, WL4, and WL5, all at time $t_1$. Step 482 in such an example would not exist and at the next time period, word lines WL1 and WL6 would be floated. Similarly, word lines WL2, WL5, WL1, and WL6 could be grouped together. In embodiments that include more than 8 memory cells in a NAND string, numerous subdivisions of the interior word lines can be made. For example, in a 16 memory cell NAND string having word lines WL0 through WL15, the interior word lines (WL1-WL14) could be subdivided into two subsets. The first subset can include the most interior word lines (for example, WL1-WL11), and the second subset can include the less interior word lines (WL1-WL3 and WL12-WL14). In such a case, WL4-WL11 would be floated at a first time and WL1-WL3 and WL12-WL14 would be floated at a second later time. Different subsets could also be made. For example, each of the 14 word lines can be floated individually at individual times, or the word lines can be grouped together in pairs (for example, WL1-WL14, WL2-WL13, etc.) and each group have its word lines floated at a particular time.

At step 486 (time $t_4$), WL1 and WL6 are reconnected to zero volts. At step 488 (time $t_5$), WL2 and WL5 are reconnected to 0V, and at step 490 (time $t_6$), WL3 and WL4 are reconnected to 0V. As previously described, steps 486 through 490 may not be necessary in all embodiments. Furthermore the time at which each word line is reconnected to zero volts can vary be embodiment.

FIGS. 21 through 23 illustrate reconnecting a word line to 0V after allowing it to float. Such a step is not necessary in all embodiments. In certain implementations, however, reconnecting the word line to a voltage such as 0V may be necessary in order not to avoid damage to a transistor within the memory system. FIG. 21 depicts one embodiment of row controller 306. Row controller 306 includes a control gate driver 608 and three word line switch gates 602, 604, 606. FIG. 21 depicts only a portion of the row controller. A switch gate may be present for each word line of the system. Each switch gate 602, 604, and 606 is responsible for supplying the appropriate voltages to the word lines doing various operations. For example, by supplying 0V from the control gate driver to the control gate driver line (for example, $CGD_{n-2}$ of switch gate 602) and driving the gate end of the switch gate with voltage VDD (to turn on the transistor), 0V can be placed on the corresponding word line connected to the switch gate. In order to float the word line as has been described in accordance with embodiments, control gate driver 608 can cause the control gate driver line of a switch gate (for example $CGD_{n-2}$) to float. By floating the control gate driver line, the word line connected to the corresponding switch gate will also float.

Switch gate transistors 602, 604, or 606 can become damaged if the floating condition is maintained as the p-well voltage decreases back to 0V. FIG. 22 depicts the word line voltage of a word line that is floated at time $t_1$ and allowed to continue floating throughout application of an erase voltage pulse. When the word line is floated at time $t_1$ it becomes coupled to the floating gate which in turn is strongly coupled to the p-well region. The word line voltage will rise by the increase in the p-well voltage from the moment of allowing the word line to float. If the word line is allowed to float at time $t_1$, when the p-well voltage is 18V, and the p-well voltage climbs to 20V thereafter, the word line voltage will rise to 2V. In FIG. 22, time $t_2$ is the time at which the p-well voltage begins to decrease from its peak value of 20V. Because the word line is coupled to the p-well through the control and floating gates, its voltage will decrease in a 1:1 ratio with the decrease in the p-well voltage. Accordingly, the word line voltage will decrease from 2V to −18V. This large negative voltage on the word line will be seen at the source end of switch gate 602. If a very large negative voltage is present on $WL_{n-2}$, switch gate 602 can begin to leak current, resulting in damage to switch gate 602.

In accordance with one embodiment, a word line that is floated during application of an erase voltage pulse is reconnected to 0V in order to avoid this condition from occurring. FIG. 23 illustrates such an example. In FIG. 23, the word line is floated at time $t_1$. However, the word line is reconnected to 0V at time $t_3$. Time $t_3$ can correspond to the time at which the erase voltage pulse has decreased from its peak value of 20V to 18V. Because of the decrease of 2 volts, the word line voltage will have decreased from 2V to 0V. At this time, the word line is reconnected to 0V so that it will remain at 0V thereafter. Thus, the voltage at the source of select gate 602 for example, will remain at 0V and not damage the gate. The word line can be reconnected to 0V or another voltage. Furthermore, the time does not have to correspond to the time of floating so long as the high negative voltage is avoided, numerous variations can be made.

In one embodiment, the word line switch gate signal remains at VDD throughout application of the erase voltage pulse. In order to reconnect the word line to 0V, control gate driver 608 will supply 0V to the control gate driver line (e.g., $CGD_{n-2}$). In this manner, 0V will be provided on word line $WL_{n-2}$ and no damage will be seen at the select gate. In an alternative embodiment, control gate driver 608 can provide a voltage on the control gate driver line that is greater than VDD rather than allowing the control gate driver line to float. This will also result in the word line floating if the control gate driver line voltage is larger than that provided by the switch gate signal. In yet another embodiment, row controller 306 may include individual word line switch gate signals for each select gate. In such an embodiment, 0V can be supplied to a word line by control gate driver 608 providing 0V on the control gate driver line and the word line switch gate signal providing a voltage equal to VDD. This will result in the word line that is connected to the switch gate being at 0V. In such an embodiment, it is not necessary to float or provide a voltage greater than VDD to the control gate driver line. By supplying 0V to the gate of the select gate, the word line is forced to float. Thereafter, in order to reconnect the word line to 0V, the switch gate signal can again be driven with VDD in order to turn on the select gate transistor and provide 0V to the word line.

The above examples are provided with respect to NAND type flash memory. However, the principles of the present invention have application to other types of non-volatile memories which utilize a serial structure, including those currently existing and those contemplated to use new technology being developed.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A non-volatile memory system, comprising:
    a set of non-volatile storage elements having a well region, said set includes a first and a second subset of non-volatile storage elements, said first subset is interior to said second subset;
    said set of non-volatile storage elements includes a first non-volatile storage element adjacent to a first select gate for said set and a second non-volatile storage element adjacent to a second select gate for said set;
    said second subset of non-volatile storage elements is interior with respect to said first non-volatile storage element and said second non-volatile storage element; and
    managing circuitry in communication with said set of non-volatile storage elements, said managing circuitry receives a request to erase said set, said managing circuitry, in response to said request, applies a first voltage signal to each non-volatile storage element in said set, applies an erase voltage to said well region, and changes said first voltage signal for each non-volatile storage element in said first subset after beginning application of said erase voltage, said managing circuitry changes said first voltage signal while applying said erase voltage to said well region, said managing circuitry changes said first voltage signal for each non-volatile storage element in said second subset after changing said first voltage signal for each non-volatile storage element in said first subset.

2. The non-volatile memory system of claim 1, wherein:
    said managing circuitry changes said first voltage signal for each non-volatile storage element in said first subset by floating a control gate of each non-volatile storage element in said first subset.

3. The non-volatile memory system of claim 2, wherein:
    said erase voltage is an erase voltage pulse having a peak value; and
    said managing circuitry begins floating a control gate of each non-volatile storage element in said first subset prior to said erase voltage pulse reaching said peak value;
    said first voltage signal comprises a first voltage applied to each non-volatile storage element in said set by said managing circuitry; and
    said managing circuitry reapplies said first voltage to said first subset of non-volatile storage elements after floating said control gate of each non-volatile storage element in said first subset, said managing circuitry reapplies said first voltage while said erase voltage pulse is still being applied to said well region and after said erase voltage pulse reaches said peak value.

4. The non-volatile memory system of claim 1, wherein:
    said managing circuitry changes said first voltage signal by providing a single change to said first voltage signal for each non-volatile storage element in said first subset.

5. The non-volatile memory system of claim 1, wherein:
    said set of non-volatile storage elements is a NAND string of multi-state flash memory devices;
    said set of multi-state flash memory devices is part of an array of multi-state flash memory devices;
    said array is in communication with a host system; and
    said array is removable from said host system.

6. The non-volatile memory system of claim 1, wherein said managing circuitry transfers charge from a floating gate of each non-volatile storage element in said set of non-volatile storage elements while applying said erase voltage to said well region.

7. A non-volatile memory system, comprising:
a set of non-volatile storage elements having a well region, said set includes a first and a second subset of non-volatile storage elements, said first subset is interior to said second subset;
managing circuitry in communication with said set of non-volatile storage elements, said managing circuitry receives a request to erase said set, said managing circuitry, in response to said request, applies a first voltage signal to each non-volatile storage element in said set, applies an erase voltage to said well region, and changes said first voltage signal for each non-volatile storage element in said first subset after beginning application of said erase voltage, said managing circuitry changes said first voltage signal by floating a control gate of each non-volatile storage element in said first subset while applying said erase voltage to said well region.

8. The non-volatile memory system of claim 7, wherein:
said set non-volatile storage elements is coupled to a set of word lines;
said first subset of non-volatile storage elements is coupled to a first subset of word lines;
said second subset of non-volatile storage elements is coupled to a second subset of word lines; and
said managing circuitry floats a control gate of each non-volatile storage element in said first subset by floating said first subset of word lines.

9. The non-volatile memory system of claim 7, wherein:
said managing circuitry applies a first voltage to a control gate of each non-volatile storage element in said set prior to floating a control gate of each non-volatile storage element in said first subset of non-volatile storage elements, said managing circuitry applies said first voltage while applying said erase voltage.

10. The non-volatile memory system of claim 9, wherein:
said erase voltage is an erase voltage pulse having a peak value; and
said managing circuitry floats a control gate of each non-volatile storage element in said first subset prior to said erase voltage pulse reaching said peak value.

11. The non-volatile memory system of claim 9, wherein:
said managing circuitry reapplies said first voltage to said control gate of each non-volatile storage element in said first subset, said managing circuitry begins reapplying said first voltage while said erase voltage pulse is being applied to said well region.

12. The non-volatile memory system of claim 11, wherein:
said managing circuitry begins reapplying said first voltage after said erase voltage pulse begins decreasing from said peak value.

13. The non-volatile memory system of claim 7, wherein:
said managing circuitry causes a first potential to exist between a floating gate of each non-volatile storage element in said second subset and said well region by applying said erase voltage and applying said first voltage; and
said managing circuitry causes a second potential to exist between a floating gate of each non-volatile storage element in said first subset and said well region by applying said erase voltage, applying said first voltage, and floating said control gate of each non-volatile storage element in said first subset, said first potential is substantially equal to said second potential.

14. The non-volatile memory system of claim 7, wherein:
said non-volatile storage elements of said set are coupled together in series and include a first non-volatile storage element adjacent to a first select gate for said set and a second non-volatile storage element adjacent to a second select gate for said set;
said second subset of non-volatile storage elements is interior with respect to said first non-volatile storage element and said second non-volatile storage element; and
said managing circuitry floats a control gate of each non-volatile storage element in said second subset after beginning application of said erase voltage and while still applying said erase voltage, said managing circuitry begins floating said control gate of each non-volatile storage element in said second subset after beginning to float said control gate of each non-volatile storage element in said first subset.

15. The non-volatile memory system of claim 7, wherein:
said managing circuitry floats said control gate of each non-volatile storage element in said first subset by providing no electrical connection to said control gate of each non-volatile storage element in said first subset.

16. The non-volatile memory system of claim 7, wherein:
said set of non-volatile storage elements is part of an array of non-volatile storage elements;
said array is in communication with a host system;
said array is removable from said host system; and
said managing circuitry includes at least one of a controller, a state machine, and a row controller.

17. A non-volatile memory system, comprising:
a set of non-volatile storage elements having a well region, said set includes a first and a second subset of non-volatile storage elements, said first subset is interior to said second subset;
a set of word lines coupled to said set of non-volatile storage elements, said set includes a first subset of word lines in communication with said first subset of non-volatile storage elements and a second subset of word lines in communication with said second subset of non-volatile storage elements; and
managing circuitry in communication with said set of non-volatile storage elements, said managing circuitry receives a request to erase said set, said managing circuitry, in response to said request, applies a first voltage signal to each non-volatile storage element in said set, applies an erase voltage to said well region, and changes said first voltage signal for each non-volatile storage element in said first subset after beginning application of said erase voltage and while still applying said erase voltage, said managing circuitry enforces a first voltage condition on said set of word lines as part of applying said first voltage signal and stops enforcement of said first voltage condition on said first subset of word lines to change said first voltage signal for each non-volatile storage element in said first subset while continuing to enforce said first voltage condition on said second subset of word lines.

18. The method of claim 17, wherein:
said managing circuitry stops enforcement of said first voltage condition by floating each word line in said first subset of word lines.

19. The non-volatile memory system of claim 17, wherein:
said erase voltage is an erase voltage pulse having a peak value;
said managing circuitry stops enforcement of said first voltage condition prior to said erase voltage pulse reaching said peak value;
said managing circuitry enforces said first voltage condition on said set of word lines by applying a first voltage to each word line in said set; and said managing circuitry reapplies said first voltage to said first subset of word lines after said erase voltage pulse reaches said peak value, said managing circuitry begins reapplying said first voltage while said erase voltage pulse is being applied to said well region and after stopping enforcement of said first voltage condition.

20. The non-volatile memory system of claim 17, wherein:

said set of non-volatile storage elements includes a third subset of non-volatile storage elements, said first subset of non-volatile storage elements is interior to said third subset of non-volatile storage elements;

said set of word lines includes a third subset of word lines in communication with said third subset of non-volatile storage elements;

said managing circuitry stops enforcement of said first voltage condition on said third subset of word lines to change said first voltage signal for each non-volatile storage element in said third subset, said managing circuitry stops enforcement of said first voltage condition on said third subset of word lines after stopping enforcement of said first voltage condition on said first subset of word lines; and said managing circuitry continues to enforce said first voltage condition on each word line of said set that is not in said first subset or said third subset after stopping enforcement of said first voltage condition on said first subset and said third subset of word lines.

21. The non-volatile memory system of claim 17, wherein:

said set of non-volatile storage elements is a NAND string of flash memory cells.

* * * * *